US012659796B2

(12) United States Patent
Berger et al.

(10) Patent No.: US 12,659,796 B2
(45) Date of Patent: Jun. 16, 2026

(54) UNEQUAL ERROR PROTECTION USING SYSTEMATIC POLAR CODES

(71) Applicant: QUALCOMM Incorporated, San Diego, CA (US)

(72) Inventors: Peer Berger, Hod Hasharon (IL); Shay Landis, Hod Hasharon (IL); Gideon Shlomo Kutz, Ramat Hasharon (IL)

(73) Assignee: QUALCOMM Incorporated, San Diego, CA (US)

( * ) Notice: Subject to any disclaimer, the term of this patent is extended or adjusted under 35 U.S.C. 154(b) by 357 days.

(21) Appl. No.: 18/365,622

(22) Filed: Aug. 4, 2023

(65) Prior Publication Data

US 2025/0048178 A1    Feb. 6, 2025

(51) Int. Cl.
*H04W 28/04* (2009.01)
*H03M 13/13* (2006.01)
*H04L 1/00* (2006.01)

(52) U.S. Cl.
CPC ........... *H04W 28/04* (2013.01); *H03M 13/13* (2013.01); *H04L 1/0057* (2013.01); *H04L 1/0061* (2013.01); *H04L 1/007* (2013.01)

(58) Field of Classification Search
None
See application file for complete search history.

(56) References Cited

U.S. PATENT DOCUMENTS

2020/0099393 A1* 3/2020 Xu ......................... H03M 13/13
2020/0266957 A1* 8/2020 Gulati ................... H04L 1/0063
2023/0007084 A1* 1/2023 Dou ....................... H04L 5/0053

* cited by examiner

*Primary Examiner* — Walter J DiVito
(74) *Attorney, Agent, or Firm* — Holland & Hart LLP

(57) ABSTRACT

Methods, systems, and devices for wireless communications are described. Systematic polar codes may be used for the transmission of information bits to a wireless communications device, such as for extended reality (XR) applications, online video application, or other applications. In such cases, information bits of a data stream may be sorted based on priority or importance. Additionally, in accordance with the use of systematic polar coding, bit-channels may be sorted by protection level, and the sorted bits may be mapped to the most highly protected bit-channels (e.g., based on the importance of the bits). The mapped bits may be encoded using a systematic polar encoder to generate a codeword, and the codeword may be transmitted to another wireless communications device.

30 Claims, 12 Drawing Sheets

Input
Vector U $U_0$

210

220

$S_0$ $U_1$ $S_1$ $U_{N/2-2}$ $S_{N/2-2}$ $U_{N/2-1}$ $S_{N/2-1}$ $U_{N/2}$ $S_{N/2}$ $U_{N/2+1}$ $S_{N/2+1}$

225

235

$U_{N-2}$ $S_{N-2}$

230

$U_{N-1}$ $S_{N-1}$ $R_N$ $V_0$ $V_1$ $V_{N/2-2}$ $V_{N/2-1}$ $V_{N/2}$ $V_{N/2+1}$ $V_{N-2}$ $V_{N-1}$ $W_{N/2}$

215

$W_{N/2}$

240

Codeword Y $Y_0$ $Y_1$ $Y_{N/2-2}$ $Y_{N/2-1}$ $Y_{N/2}$ $Y_{N/2+1}$ $Y_{N-2}$ $Y_{N-1}$ $W_N$

200

130                    105                                    115

Network
Entity

Transceiver                          Antenna 1010                                 1015

Memory

Communications
Manager                              Code

1030

1020                    1025

1040

Processor

1035

1005

1000

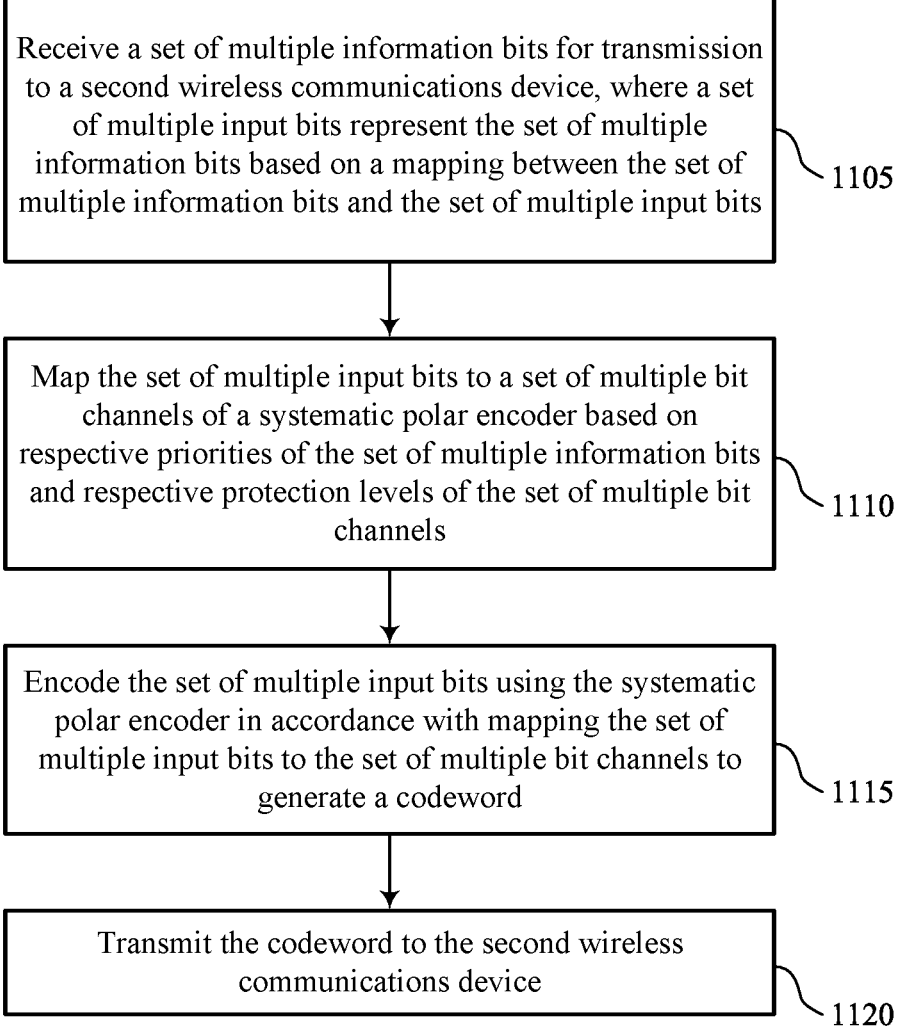

Receive a set of multiple information bits for transmission to a second wireless communications device, where a set of multiple input bits represent the set of multiple information bits based on a mapping between the set of multiple information bits and the set of multiple input bits

1105

Map the set of multiple input bits to a set of multiple bit channels of a systematic polar encoder based on respective priorities of the set of multiple information bits and respective protection levels of the set of multiple bit channels

1110

Encode the set of multiple input bits using the systematic polar encoder in accordance with mapping the set of multiple input bits to the set of multiple bit channels to generate a codeword

1115

Transmit the codeword to the second wireless communications device

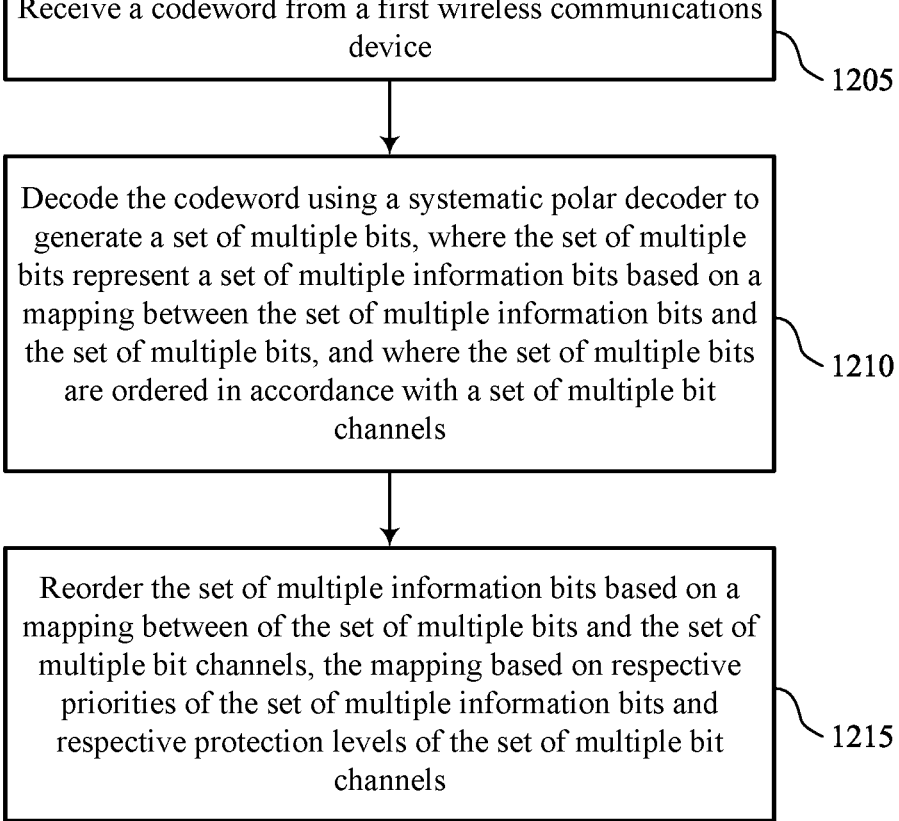

Receive a codeword from a first wireless communications device

1205

Decode the codeword using a systematic polar decoder to generate a set of multiple bits, where the set of multiple bits represent a set of multiple information bits based on a mapping between the set of multiple information bits and the set of multiple bits, and where the set of multiple bits are ordered in accordance with a set of multiple bit channels

1210

Reorder the set of multiple information bits based on a mapping between of the set of multiple bits and the set of multiple bit channels, the mapping based on respective priorities of the set of multiple information bits and respective protection levels of the set of multiple bit channels

UNEQUAL ERROR PROTECTION USING SYSTEMATIC POLAR CODES

FIELD OF TECHNOLOGY

The following relates to wireless communications, including unequal error protection using systematic polar codes.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations, each supporting wireless communication for communication devices, which may be known as user equipment (UE).

SUMMARY

The described techniques relate to improved methods, systems, devices, and apparatuses that support unequal error protection using systematic polar codes. For example, the described techniques provide for increasing reliability for the most important aspects of application data (e.g., data of an extended reality (XR) stream, data for online applications, among other examples). Polar encoding involves assigning bits to different channels, and encoding the bits such that certain bit-channels (e.g., polar channels) are associated with increased reliability, while other bit-channels are associated with decrease reliability (such that respective bit channels may be "polarized" in terms of reliability). With systematic polar codes (e.g., where information bits may transparently appear as part of a generated codeword), the bit-channels may be sorted by protection level, such as by most protected bit-channel to least protected bit-channel. To ensure that systematic polar codes for some applications (e.g., XR, video applications, or the like) have increased protection level for the aspects of the application that are most important, the information bits of a stream may be sorted based on priority or importance (e.g., bit by bit, or in groups). Then the sorted information bits may be mapped to the most protected bit-channels of a systematic polar encoder. Errors in the transmission may therefore be most likely to occur in relatively less important bits (e.g., bits mapped to the less protected bit-channels). Accordingly, the information bits that are most important to user experience/perception are the most likely to be successfully received and decoded at the receiver.

A method for wireless communications by a first wireless communications device is described. The method may include receiving a set of multiple information bits for transmission to a second wireless communications device, where a set of multiple input bits represent the set of multiple information bits based on a mapping between the set of multiple information bits and the set of multiple input bits, mapping the set of multiple input bits to a set of multiple bit channels of a systematic polar encoder based on respective priorities of the set of multiple information bits and respective protection levels of the set of multiple bit channels, encoding the set of multiple input bits using the systematic polar encoder in accordance with mapping the set of multiple input bits to the set of multiple bit channels to generate a codeword, and transmitting the codeword to the second wireless communications device.

A first wireless communications device for wireless communications is described. The first wireless communications device may include one or more memories storing processor executable code, and one or more processors coupled with the one or more memories. The one or more processors may individually or collectively operable to execute the code to cause the first wireless communications device to receive a set of multiple information bits for transmission to a second wireless communications device, where a set of multiple input bits represent the set of multiple information bits based on a mapping between the set of multiple information bits and the set of multiple input bits, map the set of multiple input bits to a set of multiple bit channels of a systematic polar encoder based on respective priorities of the set of multiple information bits and respective protection levels of the set of multiple bit channels, encode the set of multiple input bits using the systematic polar encoder in accordance with mapping the set of multiple input bits to the set of multiple bit channels to generate a codeword, and transmit the codeword to the second wireless communications device.

Another first wireless communications device for wireless communications is described. The first wireless communications device may include means for receiving a set of multiple information bits for transmission to a second wireless communications device, where a set of multiple input bits represent the set of multiple information bits based on a mapping between the set of multiple information bits and the set of multiple input bits, means for mapping the set of multiple input bits to a set of multiple bit channels of a systematic polar encoder based on respective priorities of the set of multiple information bits and respective protection levels of the set of multiple bit channels, means for encoding the set of multiple input bits using the systematic polar encoder in accordance with mapping the set of multiple input bits to the set of multiple bit channels to generate a codeword, and means for transmitting the codeword to the second wireless communications device.

A non-transitory computer-readable medium storing code for wireless communications is described. The code may include instructions executable by one or more processors to receive a set of multiple information bits for transmission to a second wireless communications device, where a set of multiple input bits represent the set of multiple information bits based on a mapping between the set of multiple information bits and the set of multiple input bits, map the set of multiple input bits to a set of multiple bit channels of a systematic polar encoder based on respective priorities of the set of multiple information bits and respective protection levels of the set of multiple bit channels, encode the set of multiple input bits using the systematic polar encoder in accordance with mapping the set of multiple input bits to the set of multiple bit channels to generate a codeword, and transmit the codeword to the second wireless communications device.

In some examples of the method, first wireless communications devices, and non-transitory computer-readable medium described herein, mapping the set of multiple input bits to the set of multiple bit channels may include operations, features, means, or instructions for determining a first subset of bit channels from the set of multiple bit channels based on a respective protection level for each bit channel of the set of multiple bit channels, the first subset of bit channels including information bit channels, where a second subset of bit channels of the set of multiple bit channels includes frozen bit channels and mapping the set of multiple input bits to the first subset of bit channels.

Some examples of the method, first wireless communications devices, and non-transitory computer-readable medium described herein may further include operations, features, means, or instructions for ordering the first subset of bit channels in accordance with the respective protection levels of the first subset of bit channels, each respective protection level being based on an error probability for each bit channel of the first subset of bit channels, where mapping the set of multiple input bits to the first subset of bit channels may be based on ordering the first subset of bit channels.

Some examples of the method, first wireless communications devices, and non-transitory computer-readable medium described herein may further include operations, features, means, or instructions for identifying the first subset of bit channels based on a weighting applied to respective error probabilities associated with the first subset of bit channels, where the ordering may be based on an evaluation of a bit error rate associated with each error probability.

Some examples of the method, first wireless communications devices, and non-transitory computer-readable medium described herein may further include operations, features, means, or instructions for identifying the first subset of bit channels based on a threshold error probability associated with the set of multiple bit channels, where the ordering may be based on an evaluation starting from a last-indexed bit channel of the set of multiple bit channels to identify an index associated with the threshold error probability, and subsequently evaluating bit channels having indices that may be greater than the index associated with the threshold error probability and based on a block length of the systematic polar encoder.

In some examples of the method, first wireless communications devices, and non-transitory computer-readable medium described herein, mapping the set of multiple input bits to the set of multiple bit channels may include operations, features, means, or instructions for mapping respective bits of the set of multiple input bits to respective bit channels of the set of multiple bit channels, the respective bits being ordered according to an importance metric for each bit, and the respective bit channels being ordered according to a protection level for each bit channel, where the respective bits may be mapped to the respective bit channels based on an ordering of the respective bits and an ordering of the respective bit channels.

In some examples of the method, first wireless communications devices, and non-transitory computer-readable medium described herein, a ratio between a first quantity of bit channels of the first subset of bit channels and a second quantity of bit channels of the second subset of bit channels may be based on a channel capacity of a communication channel between the first wireless communications device and the second wireless communications device.

Some examples of the method, first wireless communications devices, and non-transitory computer-readable medium described herein may further include operations, features, means, or instructions for appending a set of cyclic redundancy check bits to the set of multiple input bits and encrypting the codeword, where the codeword transmitted to the second wireless communications device includes the encrypted codeword.

Some examples of the method, first wireless communications devices, and non-transitory computer-readable medium described herein may further include operations, features, means, or instructions for communicating an indication of the mapping between the set of multiple input bits to the set of multiple bit channels with the second wireless communications device.

In some examples of the method, first wireless communications devices, and non-transitory computer-readable medium described herein, the mapping between the set of multiple input bits to the set of multiple bit channels may be predefined or preconfigured.

In some examples of the method, first wireless communications devices, and non-transitory computer-readable medium described herein, the set of multiple information bits includes a stream of extended reality data.

In some examples of the method, first wireless communications devices, and non-transitory computer-readable medium described herein, the set of multiple information bits may be associated with one or more applications that operate in accordance with one or more bit error rate parameters, the one or more applications being associated with real-time video or real-time audio, or any combination thereof.

A method for wireless communications by a second wireless communications device is described. The method may include receiving a codeword from a first wireless communications device, decoding the codeword using a systematic polar decoder to generate a set of multiple bits, where the set of multiple bits represent a set of multiple information bits based on a mapping between the set of multiple information bits and the set of multiple bits, and where the set of multiple bits are ordered in accordance with a set of multiple bit channels, and reordering the set of multiple information bits based on a mapping between of the set of multiple bits and the set of multiple bit channels, the mapping based on respective priorities of the set of multiple information bits and respective protection levels of the set of multiple bit channels.

A second wireless communications device for wireless communications is described. The second wireless communications device may include one or more memories storing processor executable code, and one or more processors coupled with the one or more memories. The one or more processors may individually or collectively operable to execute the code to cause the second wireless communications device to receive a codeword from a first wireless communications device, decode the codeword using a systematic polar decoder to generate a set of multiple bits, where the set of multiple bits represent a set of multiple information bits based on a mapping between the set of multiple information bits and the set of multiple bits, and where the set of multiple bits are ordered in accordance with a set of multiple bit channels, and reorder the set of multiple information bits based on a mapping between of the set of multiple bits and the set of multiple bit channels, the mapping based on respective priorities of the set of multiple information bits and respective protection levels of the set of multiple bit channels.

Another second wireless communications device for wireless communications is described. The second wireless communications device may include means for receiving a codeword from a first wireless communications device, means for decoding the codeword using a systematic polar decoder to generate a set of multiple bits, where the set of multiple bits represent a set of multiple information bits based on a mapping between the set of multiple information bits and the set of multiple bits, and where the set of multiple bits are ordered in accordance with a set of multiple bit channels, and means for reordering the set of multiple information bits based on a mapping between of the set of multiple bits and the set of multiple bit channels, the mapping based on respective priorities of the set of multiple information bits and respective protection levels of the set of multiple bit channels.

A non-transitory computer-readable medium storing code for wireless communications is described. The code may include instructions executable by one or more processors to receive a codeword from a first wireless communications device, decode the codeword using a systematic polar decoder to generate a set of multiple bits, where the set of multiple bits represent a set of multiple information bits based on a mapping between the set of multiple information bits and the set of multiple bits, and where the set of multiple bits are ordered in accordance with a set of multiple bit channels, and reorder the set of multiple information bits based on a mapping between of the set of multiple bits and the set of multiple bit channels, the mapping based on respective priorities of the set of multiple information bits and respective protection levels of the set of multiple bit channels.

In some examples of the method, second wireless communications devices, and non-transitory computer-readable medium described herein, the set of multiple bit channels includes a first subset of bit channels and a second subset of bit channels, the first subset of bit channels including information bit channels and the second subset of bit channels including frozen bit channels.

In some examples of the method, second wireless communications devices, and non-transitory computer-readable medium described herein, an order of the first subset of bit channels may be in accordance with the respective protection levels of the first subset of bit channels, each respective protection level being based on an error probability for each bit channel of the first subset of bit channels and the set of multiple bits may be mapped to the first subset of bit channels based on the order of the first subset of bit channels.

In some examples of the method, second wireless communications devices, and non-transitory computer-readable medium described herein, the respective protection levels of the first subset of bit channels may be based on a weighting applied to respective error probabilities associated with the first subset of bit channels and the order of the first subset of bit channels may be based on an evaluation of a bit error rate associated with each error probability.

In some examples of the method, second wireless communications devices, and non-transitory computer-readable medium described herein, the respective protection levels of the first subset of bit channels may be based on a threshold error probability associated with the set of multiple bit channels and the order of the first subset of bit channels may be based on an evaluation starting from a last-indexed channel of the set of multiple bit channels to identify an index associated with the threshold error probability, and a subsequent evaluation of bit channels having indices that may be greater than the index associated with the threshold error probability and based on a block length of the systematic polar decoder.

BRIEF DESCRIPTION OF THE DRAWINGS

FIGS. 11 and 12 show flowcharts illustrating methods that support unequal error protection using systematic polar codes in accordance with one or more aspects of the present disclosure.

DETAILED DESCRIPTION

Figure 1:
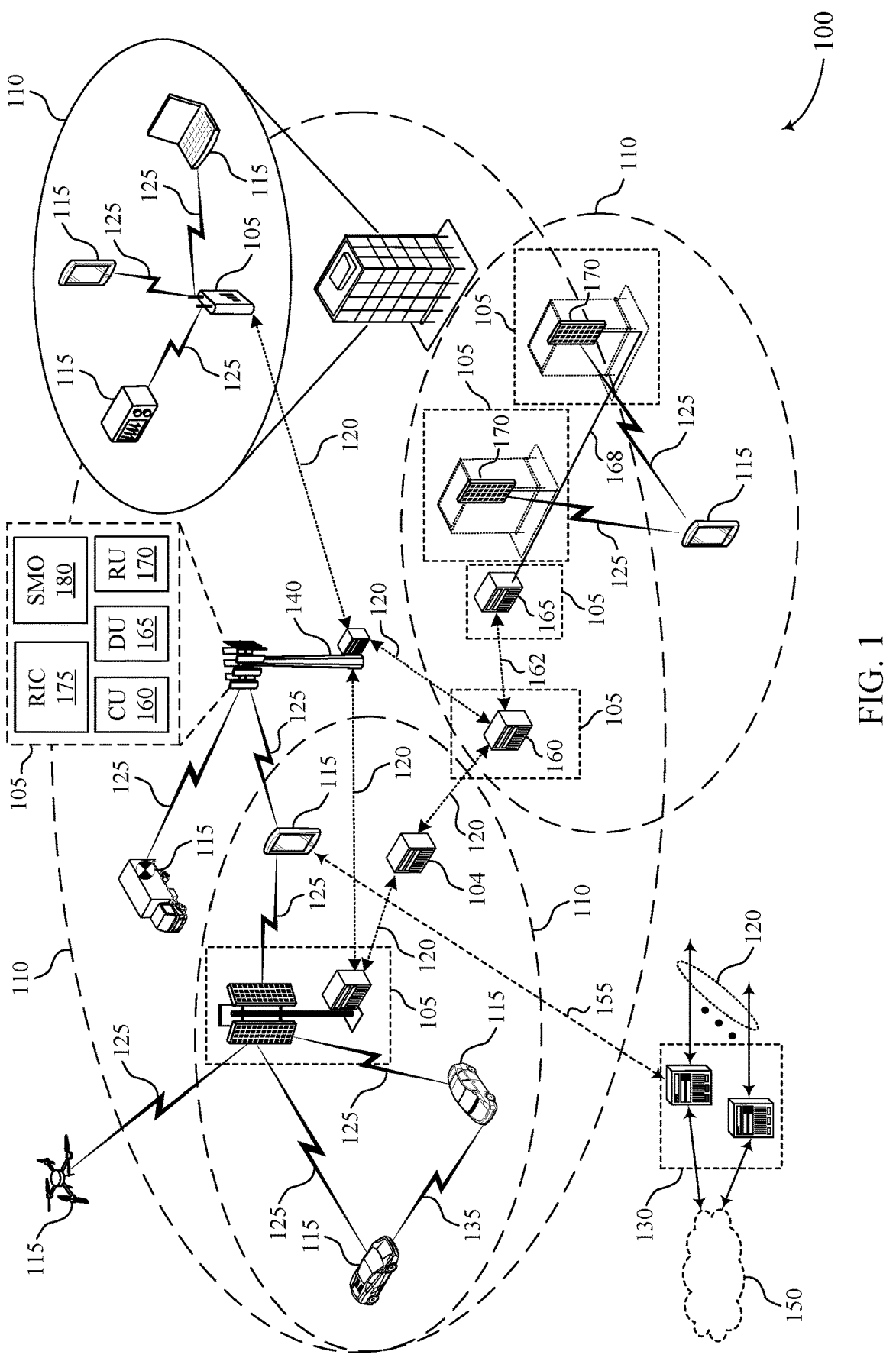
FIG. 1 shows an example of a wireless communications system that supports unequal error protection using systematic polar codes in accordance with one or more aspects of the present disclosure.

Extended reality (XR) traffic in a wireless communications system (e.g., a 5G system) may include virtual reality (VR) traffic, augmented reality (AR) traffic, mixed reality (MR) traffic, and the like. XR traffic may be associated with high reliability and low latency transmissions. For example, a network entity may transmit video frames to XR devices (e.g., which may include user equipment (UEs) that are in communication with an XR device), and an XR device (or UE) that may transmit video frames to a network entity. In some cases, XR video frames may be associated with relatively complex encoding and decoding processes, which may be problematic for some XR devices, as such devices may inherently need to be relatively lightweight and low-power devices.

Polar codes may be used to reduce latency and power by providing efficient and relatively low complexity decoding of wireless communications. Polar coding may involve assigning bits to different bit-channels and encoding the bits such that certain bit-channels (e.g., polar channels) are associated with an increased reliability, while other bit-channels are associated with a decreased reliability (such that respective bit channels are polarized). A device may sort the bit-channels by levels of reliability, such as by most reliable bit-channel to least reliable bit-channel. Systematic polar coding may further improve on polar coding in various ways, where systematic polar codes may refer to polar codes in which information bits transparently appear as part of a generated codeword (whereas non-systematic polar codes may not have information bits transparently appearing as part of the codeword). Non-systematic polar codes may be modified into systematic polar codes, and systematic polar codes may provide the same performance as non-systematic polar codes (e.g., in terms of a block error rate (BLER)), while also providing some other improved performance (e.g., an improved bit error rate (BER)).

Some schemes for mapping information bits to bit-channels for polar coding (e.g., non-systematic polar coding) may aim to lower a BLER, but with some types of applications (e.g., XR applications and other video applications), some bits or groups of information bits may have a relatively higher priority and/or importance than other bits. For example, direct current (DC) and lower frequency elements of a video stream may be relatively more important to a viewer's perception than higher frequency elements. In some examples, information bits associated with motion, positioning, and the like, may have relatively increased importance to the functionality and performance of an application. In any case, a polar code whose focus is to lower BLER (e.g., a non-systematic polar code) may not be the most useful in applications having relatively more important information bits that affect application performance and user experience (such as with XR and online video applications, among other examples), and improved techniques may be desirable.

As described herein, to ensure that polar codes for some application streams (e.g., for XR and video applications) have increased reliability for the stream that are relatively important (e.g., the most important), a first wireless communications device may receive information bits of a stream that are sorted based on priority or importance. Additionally, the bit-channel associated with systematic polar coding may be sorted by protection level, such as by most protected bit-channel to least protected bit-channel. The first wireless communications device may acquire input bits as a function of the information bits and frozen bits. The frozen bits may represent bits that are known in advance by both the coder (e.g., the first wireless communications device) and decoder (e.g., a second wireless communications device). Then, the first wireless communications device may map the sorted information bits to the most protected bit-channels of a systematic polar encoder, and the systematic polar encoder may encode the input bits in accordance to the mapping. Any errors in the transmission may therefore be likely to occur in the less important bits (e.g., the bits mapped to the less protected bit-channels). In other words, the second wireless communications device may be more likely to correctly receive the most important information bits. Accordingly, the information bits that are most important to user experience/perception (such as with XR applications) may be more likely to be successfully received and decoded at the receiver.

In some aspects, the transmitting device and the receiving device may negotiate the mapping scheme, or the mapping scheme may be predefined (e.g., standardized in accordance with a wireless communications standard), so that the receiving device may correctly (e.g., successfully and accurately) reorder the decoded information bits. In systematic polar decoding, an error in any previous bit-channel may propagate to the decoding of subsequent bit-channels. Accordingly, decoding based on the mapping of most important information bits to the most highly protected bit-channels may allow for the decoding of the more important information bits that are least likely to have errors. Thus, error propagation may be reduced during the decoding.

Aspects of the disclosure are initially described in the context of wireless communications systems. Aspects of the disclosure are further illustrated by and described with reference to encoding schemes, process flows, apparatus diagrams, system diagrams, and flowcharts that relate to unequal error protection using systematic polar codes.

FIG. 1 shows an example of a wireless communications system 100 that supports unequal error protection using systematic polar codes in accordance with one or more aspects of the present disclosure. The wireless communications system 100 may include one or more network entities 105, one or more UEs 115, and a core network 130. In some examples, the wireless communications system 100 may be a Long Term Evolution (LTE) network, an LTE-Advanced (LTE-A) network, an LTE-A Pro network, a New Radio (NR) network, or a network operating in accordance with other systems and radio technologies, including future systems and radio technologies not explicitly mentioned herein.

The network entities 105 may be dispersed throughout a geographic area to form the wireless communications system 100 and may include devices in different forms or having different capabilities. In various examples, a network entity 105 may be referred to as a network element, a mobility element, a radio access network (RAN) node, or network equipment, among other nomenclature. In some examples, network entities 105 and UEs 115 may wirelessly communicate via one or more communication links 125 (e.g., a radio frequency (RF) access link). For example, a network entity 105 may support a coverage area 110 (e.g., a geographic coverage area) over which the UEs 115 and the network entity 105 may establish one or more communication links 125. The coverage area 110 may be an example of a geographic area over which a network entity 105 and a UE 115 may support the communication of signals according to one or more radio access technologies (RATs).

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be capable of supporting communications with various types of devices, such as other UEs 115 or network entities 105, as shown in FIG. 1.

As described herein, a node of the wireless communications system 100, which may be referred to as a network node, or a wireless node, may be a network entity 105 (e.g., any network entity described herein), a UE 115 (e.g., any UE described herein), a network controller, an apparatus, a device, a computing system, one or more components, or another suitable processing entity configured to perform any of the techniques described herein. For example, a node may be a UE 115. As another example, a node may be a network entity 105. As another example, a first node may be configured to communicate with a second node or a third node. In one aspect of this example, the first node may be a UE 115, the second node may be a network entity 105, and the third node may be a UE 115. In another aspect of this example, the first node may be a UE 115, the second node may be a network entity 105, and the third node may be a network entity 105. In yet other aspects of this example, the first, second, and third nodes may be different relative to these examples. Similarly, reference to a UE 115, network entity 105, apparatus, device, computing system, or the like may include disclosure of the UE 115, network entity 105, apparatus, device, computing system, or the like being a node. For example, disclosure that a UE 115 is configured to receive information from a network entity 105 also discloses that a first node is configured to receive information from a second node.

In some examples, network entities 105 may communicate with the core network 130, or with one another, or both. For example, network entities 105 may communicate with the core network 130 via one or more backhaul communication links 120 (e.g., in accordance with an S1, N2, N3, or other interface protocol). In some examples, network entities 105 may communicate with one another via a backhaul communication link 120 (e.g., in accordance with an X2, Xn, or other interface protocol) either directly (e.g., directly between network entities 105) or indirectly (e.g., via a core network 130). In some examples, network entities 105 may communicate with one another via a midhaul communication link 162 (e.g., in accordance with a midhaul interface protocol) or a fronthaul communication link 168 (e.g., in accordance with a fronthaul interface protocol), or any combination thereof. The backhaul communication links 120, midhaul communication links 162, or fronthaul communication links 168 may be or include one or more wired links (e.g., an electrical link, an optical fiber link), one or more wireless links (e.g., a radio link, a wireless optical link), among other examples or various combinations thereof. A UE 115 may communicate with the core network 130 via a communication link 155.

One or more of the network entities 105 described herein may include or may be referred to as a base station 140 (e.g., a base transceiver station, a radio base station, an NR base station, an access point, a radio transceiver, a NodeB, an eNodeB (eNB), a next-generation NodeB or a giga-NodeB (either of which may be referred to as a gNB), a 5G NB, a next-generation eNB (ng-eNB), a Home NodeB, a Home eNodeB, or other suitable terminology). In some examples, a network entity 105 (e.g., a base station 140) may be implemented in an aggregated (e.g., monolithic, standalone) base station architecture, which may be configured to utilize a protocol stack that is physically or logically integrated within a single network entity 105 (e.g., a single RAN node, such as a base station 140).

In some examples, a network entity 105 may be implemented in a disaggregated architecture (e.g., a disaggregated base station architecture, a disaggregated RAN architecture), which may be configured to utilize a protocol stack that is physically or logically distributed among two or more network entities 105, such as an integrated access backhaul (IAB) network, an open RAN (O-RAN) (e.g., a network configuration sponsored by the O-RAN Alliance), or a virtualized RAN (vRAN) (e.g., a cloud RAN (C-RAN)). For example, a network entity 105 may include one or more of a central unit (CU) 160, a distributed unit (DU) 165, a radio unit (RU) 170, a RAN Intelligent Controller (RIC) 175 (e.g., a Near-Real Time RIC (Near-RT RIC), a Non-Real Time RIC (Non-RT RIC)), a Service Management and Orchestration (SMO) 180 system, or any combination thereof. An RU 170 may also be referred to as a radio head, a smart radio head, a remote radio head (RRH), a remote radio unit (RRU), or a transmission reception point (TRP). One or more components of the network entities 105 in a disaggregated RAN architecture may be co-located, or one or more components of the network entities 105 may be located in distributed locations (e.g., separate physical locations). In some examples, one or more network entities 105 of a disaggregated RAN architecture may be implemented as virtual units (e.g., a virtual CU (VCU), a virtual DU (VDU), a virtual RU (VRU)).

The split of functionality between a CU 160, a DU 165, and an RU 170 is flexible and may support different functionalities depending on which functions (e.g., network layer functions, protocol layer functions, baseband functions, RF functions, and any combinations thereof) are performed at a CU 160, a DU 165, or an RU 170. For example, a functional split of a protocol stack may be employed between a CU 160 and a DU 165 such that the CU 160 may support one or more layers of the protocol stack and the DU 165 may support one or more different layers of the protocol stack. In some examples, the CU 160 may host upper protocol layer (e.g., layer 3 (L3), layer 2 (L2)) functionality and signaling (e.g., Radio Resource Control (RRC), service data adaption protocol (SDAP), Packet Data Convergence Protocol (PDCP)). The CU 160 may be connected to one or more DUs 165 or RUs 170, and the one or more DUs 165 or RUs 170 may host lower protocol layers, such as layer 1 (L1) (e.g., physical (PHY) layer) or L2 (e.g., radio link control (RLC) layer, medium access control (MAC) layer) functionality and signaling, and may each be at least partially controlled by the CU 160. Additionally, or alternatively, a functional split of the protocol stack may be employed between a DU 165 and an RU 170 such that the DU 165 may support one or more layers of the protocol stack and the RU 170 may support one or more different layers of the protocol stack. The DU 165 may support one or multiple different cells (e.g., via one or more RUs 170). In some cases, a functional split between a CU 160 and a DU 165, or between a DU 165 and an RU 170 may be within a protocol layer (e.g., some functions for a protocol layer may be performed by one of a CU 160, a DU 165, or an RU 170, while other functions of the protocol layer are performed by a different one of the CU 160, the DU 165, or the RU 170). A CU 160 may be functionally split further into CU control plane (CU-CP) and CU user plane (CU-UP) functions. A CU 160 may be connected to one or more DUs 165 via a midhaul communication link 162 (e.g., F1, F1-c. F1-u), and a DU 165 may be connected to one or more RUs 170 via a fronthaul communication link 168 (e.g., open fronthaul (FH) interface). In some examples, a midhaul communication link 162 or a fronthaul communication link 168 may be implemented in accordance with an interface (e.g., a channel) between layers of a protocol stack supported by respective network entities 105 that are in communication via such communication links.

In wireless communications systems (e.g., wireless communications system 100), infrastructure and spectral resources for radio access may support wireless backhaul link capabilities to supplement wired backhaul connections, providing an IAB network architecture (e.g., to a core network 130). In some cases, in an IAB network, one or more network entities 105 (e.g., IAB nodes 104) may be partially controlled by each other. One or more IAB nodes 104 may be referred to as a donor entity or an IAB donor. One or more DUs 165 or one or more RUs 170 may be partially controlled by one or more CUs 160 associated with a donor network entity 105 (e.g., a donor base station 140). The one or more donor network entities 105 (e.g., IAB donors) may be in communication with one or more additional network entities 105 (e.g., IAB nodes 104) via supported access and backhaul links (e.g., backhaul communication links 120). IAB nodes 104 may include an IAB mobile termination (IAB-MT) controlled (e.g., scheduled) by DUs 165 of a coupled IAB donor. An IAB-MT may include an independent set of antennas for relay of communications with UEs 115, or may share the same antennas (e.g., of an RU 170) of an IAB node 104 used for access via the DU 165 of the IAB node 104 (e.g., referred to as virtual IAB-MT (vIAB-MT)). In some examples, the IAB nodes 104 may include DUs 165 that support communication links with additional entities (e.g., IAB nodes 104, UEs 115) within the relay chain or configuration of the access network (e.g., downstream). In such cases, one or more components of the disaggregated RAN architecture (e.g., one or more IAB nodes 104 or components of IAB nodes 104) may be configured to operate according to the techniques described herein.

In the case of the techniques described herein applied in the context of a disaggregated RAN architecture, one or more components of the disaggregated RAN architecture may be configured to support unequal error protection using systematic polar codes as described herein. For example, some operations described as being performed by a UE 115 or a network entity 105 (e.g., a base station 140) may additionally, or alternatively, be performed by one or more components of the disaggregated RAN architecture (e.g., IAB nodes 104, DUs 165, CUs 160, RUs 170, RIC 175, SMO 180).

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the network entities 105 and the network equipment including macro eNBs or gNBs, small cell eNBs or gNBs, or relay base stations, among other examples, as shown in FIG. 1.

The UEs 115 and the network entities 105 may wirelessly communicate with one another via one or more communication links 125 (e.g., an access link) using resources associated with one or more carriers. The term "carrier" may refer to a set of RF spectrum resources having a defined physical layer structure for supporting the communication links 125. For example, a carrier used for a communication link 125 may include a portion of a RF spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers. Communication between a network entity 105 and other devices may refer to communication between the devices and any portion (e.g., entity, sub-entity) of a network entity 105. For example, the terms "transmitting," "receiving," or "communicating," when referring to a network entity 105, may refer to any portion of a network entity 105 (e.g., a base station 140, a CU 160, a DU 165, a RU 170) of a RAN communicating with another device (e.g., directly or via one or more other network entities 105).

Signal waveforms transmitted via a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may refer to resources of one symbol period (e.g., a duration of one modulation symbol) and one subcarrier, in which case the symbol period and subcarrier spacing may be inversely related. The quantity of bits carried by each resource element may depend on the modulation scheme (e.g., the order of the modulation scheme, the coding rate of the modulation scheme, or both), such that a relatively higher quantity of resource elements (e.g., in a transmission duration) and a relatively higher order of a modulation scheme may correspond to a relatively higher rate of communication. A wireless communications resource may refer to a combination of an RF spectrum resource, a time resource, and a spatial resource (e.g., a spatial layer, a beam), and the use of multiple spatial resources may increase the data rate or data integrity for communications with a UE 115.

The time intervals for the network entities 105 or the UEs 115 may be expressed in multiples of a basic time unit which may, for example, refer to a sampling period of $T_s=1/(\Delta f_{max} \cdot N_f)$ seconds, for which $\Delta f_{max}$ may represent a supported subcarrier spacing, and $N_f$ may represent a supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively-numbered subframes or slots, and each subframe or slot may have the same duration. In some examples, a frame may be divided (e.g., in the time domain) into subframes, and each subframe may be further divided into a quantity of slots. Alternatively, each frame may include a variable quantity of slots, and the quantity of slots may depend on subcarrier spacing. Each slot may include a quantity of symbol periods (e.g., depending on the length of the cyclic prefix prepended to each symbol period). In some wireless communications systems 100, a slot may further be divided into multiple mini-slots associated with one or more symbols. Excluding the cyclic prefix, each symbol period may be associated with one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., a quantity of symbol periods in a TTI) may be variable. Additionally, or alternatively, the smallest scheduling unit of the wireless communications system 100 may be dynamically selected (e.g., in bursts of shortened TTIs (sTTIs)).

Physical channels may be multiplexed for communication using a carrier according to various techniques. A physical control channel and a physical data channel may be multiplexed for signaling via a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a set of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to an amount of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a network entity 105 (e.g., a base station 140, an RU 170) may be movable and therefore provide communication coverage for a moving coverage area 110. In some examples, different coverage areas 110 associated with different technologies may overlap, but the different coverage areas 110 may be supported by the same network entity 105. In some other examples, the overlapping coverage areas 110 associated with different technologies may be supported by different network entities 105. The wireless communications system 100 may include, for example, a heterogeneous network in which different types of the network entities 105 provide coverage for various coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may be configured to support communicating directly with other UEs 115 via a device-to-device (D2D) communication link 135 (e.g., in accordance with a peer-to-peer (P2P), D2D, or sidelink protocol). In some examples, one or more UEs 115 of a group that are performing D2D communications may be within the coverage area 110 of a network entity 105 (e.g., a base station 140, an RU 170), which may support aspects of such D2D communications being configured by (e.g., scheduled by)

the network entity 105. In some examples, one or more UEs 115 of such a group may be outside the coverage area 110 of a network entity 105 or may be otherwise unable to or not configured to receive transmissions from a network entity 105. In some examples, groups of the UEs 115 communicating via D2D communications may support a one-to-many (1:M) system in which each UE 115 transmits to each of the other UEs 115 in the group. In some examples, a network entity 105 may facilitate the scheduling of resources for D2D communications. In some other examples, D2D communications may be carried out between the UEs 115 without an involvement of a network entity 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the network entities 105 (e.g., base stations 140) associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

The wireless communications system 100 may operate using one or more frequency bands, which may be in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. UHF waves may be blocked or redirected by buildings and environmental features, which may be referred to as clusters, but the waves may penetrate structures sufficiently for a macro cell to provide service to the UEs 115 located indoors. Communications using UHF waves may be associated with smaller antennas and shorter ranges (e.g., less than 100 kilometers) compared to communications using the smaller frequencies and longer waves of the high frequency (HF) or very high frequency (VHF) portion of the spectrum below 300 MHz.

The wireless communications system 100 may utilize both licensed and unlicensed RF spectrum bands. For example, the wireless communications system 100 may employ License Assisted Access (LAA), LTE-Unlicensed (LTE-U) radio access technology, or NR technology using an unlicensed band such as the 5 GHz industrial, scientific, and medical (ISM) band. While operating using unlicensed RF spectrum bands, devices such as the network entities 105 and the UEs 115 may employ carrier sensing for collision detection and avoidance. In some examples, operations using unlicensed bands may be based on a carrier aggregation configuration in conjunction with component carriers operating using a licensed band (e.g., LAA). Operations using unlicensed spectrum may include downlink transmissions, uplink transmissions, P2P transmissions, or D2D transmissions, among other examples.

A network entity 105 (e.g., a base station 140, an RU 170) or a UE 115 may be equipped with multiple antennas, which may be used to employ techniques such as transmit diversity, receive diversity, multiple-input multiple-output (MIMO) communications, or beamforming. The antennas of a network entity 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a network entity 105 may be located at diverse geographic locations. A network entity 105 may include an antenna array with a set of rows and columns of antenna ports that the network entity 105 may use to support beamforming of communications with a UE 115. Likewise, a UE 115 may include one or more antenna arrays that may support various MIMO or beamforming operations. Additionally, or alternatively, an antenna panel may support RF beamforming for a signal transmitted via an antenna port.

Beamforming, which may also be referred to as spatial filtering, directional transmission, or directional reception, is a signal processing technique that may be used at a transmitting device or a receiving device (e.g., a network entity 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating along particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

XR traffic in a wireless communications system 100 may include virtual reality traffic, augmented reality traffic, and the like. XR traffic may require high reliability and low latency transmissions. For example, a network entity 105 may transmit video frames to XR devices (e.g., UEs 115 that are in connection with an XR device), and a UE 115 may transmit video frames to a network entity 105, or a UE 115 may transmit video frames to another UE 115. In some cases, XR video frames may be associated with relatively complex encoding and decoding processes, which may be problematic for some XR devices (e.g., XR devices may need to be lightweight and low-power devices). Coding schemes that decrease latency and processing overhead (the video encoder may be the most significant block for power and latency) may be used for XR traffic and/or communications of video streams. For example, coding schemes that reduce latency by eliminating HARQ feedback may be used for XR traffic and/or communications of video streams. Additionally, or alternatively, coding schemes that provide for graceful degradation of video quality, by transmitting more important visual elements (e.g., DC and lower frequency components and the accompanying most significant bits (MSBs)) at a courser analog level while further modulating finer video details using lower analog signals, may be used for XR traffic and/or communication of video streams. In such coding schemes, at high signal to noise ratios (SNRs), the decoder may retrieve most or all of the details of the video stream, while at lower SNRs, the most important video elements may still be recovered. Additionally, or alternatively, coding schemes that provide different levels of code protection for the different elements of the video stream (e.g., prioritizing DC and lower frequency components which are more important for human visual perception) may be used for XR traffic and/or communications of audio or video streams, and/or applications in which some distortion is acceptable.

The wireless communications system 100 may support the use of polar codes for wireless communications. Polar codes may be used to reduce latency and power. Polar coding may involve assigning bits to different bit-channels and encoding the bits such that certain bit-channels (e.g., polar channels) are polarized to an increase reliability, while other bit-channels are polarized to a decreased reliability. A device may sort the bit-channels by levels of reliability, such as by most reliable bit-channel to least reliable bit-channel. As an example, an encoder of a transmitting wireless communication device (e.g., a UE 115 or a network entity 105) may implement a polar code using a matrix that polarizes copies of a channel into subchannels (which may be referred to as bit channels) that are either relatively noisy (corresponding to decreased reliability) or relatively noiseless (corresponding to increased reliability). Information bits may be mapped to the relatively noiseless bit channels, and frozen bits (e.g., bits that may be known by both the transmitting wireless communication device and a receiving wireless communication device) may be mapped to the relatively noisy bit channels. The transmitting wireless communication device may transmit a codeword in accordance with the mapping to the respective bit channels. The sorted bit-channel order may depend on the capacity of the channel code. For a total of N bit-channels, to transmit using a rate R (e.g., encode the polar code with rate R), a transmitting device may transmit the information bits in K bit-channels, where K/N=R. In the other N-K bit-channels, the transmitting device may transmit frozen values known to both the receiver and transmitter. The value of R may depend on the channel capacity and the acceptable BER.

Polar codes may be linear codes that are non-systematic, and may therefore be turned into a systematic code (e.g., polar codes may be encoded systematically). As such, a systematic polar code may refer to a polar code that includes information bits that transparently appear as part of the codeword. Systematic polar codes may have relatively improved BER performance and protection over regular (e.g., non-systematic) polar codes, while maintaining the same or similar BLER performance and relatively low-complexity properties associated with non-systematic polar codes.

Current schemes for mapping information bits to bit-channels for polar coding may aim to lower a BLER, but in XR and other video applications, certain bits or groups of information bits may have a higher priority than other bits. For example, DC and lower frequency elements of a video stream may be more important to a viewer's perception than higher frequency elements. In other words, a polar code whose focus is to lower BLER may not be the most useful in XR and video applications.

In order to ensure that polar codes, for example, for wireless communications associated with XR and video applications, have increased reliability for the aspects of an XR stream or video code that are most important, a first wireless communications device may obtain information bits of a stream that are sorted based on priority or importance. Additionally, systematic polar coding may involve sorting bit-channels by protection level, such as by most protected bit-channel to least protected bit-channel. The first wireless communications device (e.g., a UE 115) may acquire input bits as a function of the information bits and frozen bits. The frozen bits may represent bits that are known in advance by both the encoder (e.g., the first wireless communications device) and decoder (e.g., a second wireless communications device). Then, the first wireless communications device may map the sorted information bits to the most protected bit-channels of a systematic polar encoder, and the systematic polar encoder may encode the input bits in accordance to the mapping. Any errors in the transmission between the first wireless communication device and the second wireless communication device may therefore be likely to occur in the relatively less important bits (e.g., the bits mapped to the less protected bit-channels). In other words, the second wireless communications device (e.g., a UE 115 or a network entity 105) may be more likely to receive the most important information bits correctly. Accordingly, in the case of XR, the information bits that are most important to user experience and/or perception may be more likely to be successfully received and correctly decoded at the receiver. The transmitting device and the receiving device may negotiate the mapping scheme, or the mapping scheme may be predefined (e.g., standardized), so that the receiving device may correctly (e.g., successfully and accurately) reorder the decoded information bits. In systematic polar decoding, an error in any previous bit-channel may propagate to the decoding of subsequent bit-channels. Accordingly, decoding based on the mapping of most important information bits to the most highly protected bit-channels may allow for the decoding of the more important information bits that are least likely to have errors. Thus, error propagation may be reduced during the decoding, thereby improving reliability and efficiency in the wireless communications system 100.

Figure 2:
FIG. 2 shows an example of an encoding scheme that supports unequal error protection using systematic polar codes in accordance with one or more aspects of the present disclosure.

FIG. 2 shows an example of an encoding scheme 200 that supports unequal error protection using systematic polar codes in accordance with one or more aspects of the present disclosure. The encoding scheme 200 may implement a systematic polar coding scheme in accordance with the techniques described herein. For example, the encoding scheme 200 may be implemented by a wireless communications device such as a UE 115 or a network entity 105 as described herein to encode and decode information bits.

The channels (e.g., W) may be a binary-input discrete memoryless channels (e.g., W:U→Y, where U represents input and Y represents output). The capacity of the channels may be represented by C=I(U; Y) and for the example of binary-input, 0≤C≤1, where C=I(U; Y) denotes mutual information and may be referred to as a mutual information polarization function.

In some wireless communications systems, channel polarization may be used to create an auxiliary channel to achieve coding gain beyond repetition. A wireless device may apply channel polarization (e.g., a polarizing transform) to obtain multiple instances of the channel (e.g., bit-channels), where each bit-channel is associated with a capacity.

Generally, a polarizing transform may be any arbitrary N×N matrix, and N may be any integer. For example, the matrix may be a binary transform and may be invertible. In some examples, such as the example illustrated in FIG. 2, a polarizing transform may be an example of a polar code and may be based on a polar kernel. For example, a polarizing transform based on a polar kernel may have N polarization levels, and may be represented by a Kronecker product of a 2×2 matrix $$\begin{pmatrix} 1 & 0 \\ 1 & 1 \end{pmatrix}$$

with dimensions $2^N \times 2^N$ (e.g., the binary [u+v, v] kernel).

In some examples, the capacity of each bit-channel of a polarizing transform may not be the same as another bit-channel. For example, for binary input bit-channels, bit-channels of punctured bits may have C=0, bit-channels of shortened bits may have C=1, and bit-channels transmitted over a given additive white gaussian noise (AWGN) channel may have a C of the corresponding channel. A higher value of C may correspond to a higher capacity, where a higher capacity indicates that the bit-channel supports a relatively higher rate in terms of bits per channel use (e.g., for a single transmission over a wireless medium) at which information can be sent with an arbitrarily low probability of error. Put another way, a relatively high capacity may correspond to a relatively high channel quality and a relatively higher reliability metric (e.g., and a relatively lower likelihood for error associated with that bit-channel).

For example, for the channel W, a device may apply a polarizing transform to obtain a bit-channel $W_1$ and a bit-channel $W_2$. $W_2$ may have a higher capacity than $W_1$ and may thus be considered to have a better channel quality and reliability than $W_1$ (e.g., $W_2$ may be decoded with a higher success rate, $W_2$ may be associated with a relatively lower likelihood for error). The capacity of the unpolarized channel W may be represented by R, the capacity of the channel $W_2$ may be represented by $W^+$, and the capacity of the channel $W_1$ may be represented by $W^-$. The polarizing transform may be based on the mutual information polarization function C=I(U; Y). That is, outputs of the mutual information polarization function (e.g., Y) may polarize based on functions associated with the transform. A mutual information transfer chart or the like may be used to establish a relationship between W and $W^+/W^-$, and thus establish the polarization of the channel.

The above operation may be performed recursively, yielding more polarization across N bit-channels, where each bit-channel has a corresponding capacity and reliability. The wireless communications device may load (e.g., assign) bits to be transmitted to the bit-channels. In some cases, the wireless communications device may load bits to bit-channels based on the reliability of each bit-channel. For example, the device may load information bits to $W_2$ and may load frozen or parity bits to $W_1$.

In some cases, a proportion of noiseless bit-channels may converge to a channel capacity for values of N that are sufficiently large. That is, some of the bits in the codeword Y may be associated with a bit-channel having a bit error rate of 0 (e.g., a bit-channel having a channel capacity of 1). Additionally, or alternatively, some of the bits in the codeword Y may be associated with a bit-channel having a bit error rate of 0.5 (e.g., a bit-channel having a channel capacity of 0). An example of the convergence of the channel capacity for values of N that are sufficiently large is illustrated below by Equation 1.

$$\begin{cases} |I_i > 1-\varepsilon| \\ |I_i < \varepsilon| \\ |\varepsilon < I_i < 1-\varepsilon| \end{cases} \xrightarrow{N \to \infty} \begin{cases} I(U; Y) \\ 1 - I(U; Y) \\ 0 \end{cases} \quad (1)$$

In the example of Equation 1, the indexes of the N bit-channels may be sorted given a capacity of the channel. In some cases, to transmit a codeword encoded using a polar code associated with a rate R, and to transmit data reliably (e.g., and associated with a large capacity and small BER), a transmitting wireless device may encode the codeword Y using an encoding scheme 200 having K bit-channels, where K/N=R. Additionally, in the other N-K bit-channels (or bits of the codeword Y), the encoding scheme 200 may include bits having a known or fixed value (e.g., frozen bits).

In one example of an encoder for two bits, the polar kernel may be a [u+v, v] kernel. Examples of the polarizing transform for the two-bit encoder are shown below with reference to Equations 2 through 4.

$$G_{[u+v,v]2} = F_{u+v,v} = \begin{bmatrix} 1 & 0 \\ 1 & 1 \end{bmatrix} \tag{2}$$

$$U_1^2 \cdot G_2 = X_1^2 \tag{3}$$

$$X_1^2 \rightarrow W_1^2 \rightarrow Y_1^2 \tag{4}$$

More generally for a polar kernel that is a [u+v, v] kernel, Equations 5 through 7 may be examples of a polarizing transform for an N-bit encoder (e.g., where N is a power of two).

$$G_{[u+v,v]N} = B_{[binary]N} \cdot F_{u+v,v}^{\otimes n} \tag{5}$$

$$U_0^{N-1} \cdot G_N = X_0^{N-1} \tag{6}$$

$$X_0^{N-1} \rightarrow W_0^{N-1} \rightarrow Y_0^{N-1} \tag{7}$$

In the example of FIG. 2, the encoding scheme 200 may be associated with N bit-channels (e.g., polarization levels, encoding branches). The encoding scheme 200 may encode a set of bits $U_N$ (including at least a portion of information bits) using a polar code (e.g., based on the polarizing transform, for example as described with reference to Equations 5 through 7). In this example, the encoding scheme 200 is associated with an N-bit encoder, and therefore receives an input vector U including a set of bits $[U_0, U_1, \ldots, U_{N-1}]$. The encoding scheme 200 may encode the set of information bits and may output an N-bit output vector $Y([Y_0, Y_1, \ldots, Y_{N-1}])$, which may also be referred to as a codeword. Because the output vector has an equal quantity of bits as the input vector, the polar code example of FIG. 2 may be referred to as a one-to-one coding scheme. Coding schemes of other bit sizes may also be used and in some cases, the output vector may have a different length than that of the input vector (e.g., coding schemes other than one-to-one coding schemes may be applied).

The multiple bit-channels may each correspond to a bit location to which the encoding scheme 200 may assign corresponding bits i of the input vector U. As illustrated in FIG. 2, the encoding scheme 200 may load a bit $U_0$ to a bit location 0 corresponding to a first bit-channel, a bit $U_1$ to a bit location 1 corresponding to a second bit-channel, and so on, up to a bit $U_{N-1}$ and a bit location N−1. A bit loaded to a bit location may undergo one or more operations (e.g., encoding operations) for the bit-channel. For example, the bit $U_0$ is received at input 210, three Boolean exclusive or (XOR) operations are performed (represented by a "+" symbol at element 220), and a bit $X_0$ of output vector X is output at 215.

Each bit-channel of encoding scheme 200 may perform zero or more encoding operations on bits U input to the bit-channel via the corresponding bit location i. Encoding a bit in one bit-channel may depend on bits input to one or more other bit-channels. For example, in the bit-channel corresponding to the bit location $U_{N-2}$, the encoding scheme 200 encodes bit $U_{N-2}$ by performing XOR operations on bits $U_{N-2}$ and $U_{N-1}$. Bit $U_{N-2}$ is received at input 225 and bit $U_{N-1}$ is received at input 230. At 235, the encoder performs an XOR operation on bits $U_{N-2}$ and $U_{N-1}$ and provides $S_{N-2}$ at output 240. Put another way, $S_{N-2} = U_{N-2}$ XOR $U_{N-1}$. The encoding scheme 200 performs similar operations in remaining bit-channels corresponding to bit locations $U_0$ to $U_{N-1}$ encode corresponding bits of the input vector. After performing the encoding operations on the bits of the input vector, the encoding scheme 200 outputs the output vector Y such that Y includes a set of encoded bits $[Y_0, Y_1, \ldots, Y_7]$.

Because the encoding scheme 200 is an example of a polar encoder (e.g., the encoding scheme 200 applies a polarizing transform based on a polar kernel), the bit-channels corresponding to the bit locations $U_0$ to $U_{N-1}$ (e.g., and the output vector Y) are polarized, such that each bit-channel may be associated with a capacity and a reliability. The device may distribute information bits (e.g., included in the input vector U) across the bit-channels based on associated reliabilities (e.g., based on a channel quality associated with each bit-channel). That is, the bits assigned to bit locations $U_0$ to $U_{N-1}$ may have varying probabilities of successful decoding (e.g., based on the corresponding reliability of each bit location $U_0$ to $U_{N-1}$) once output Y is transmitted and received at a receiver. In some cases, the varying probabilities of successful decoding, or likelihoods for errors associated with each bit-channel may be a characteristic of the polar code, and may be known by both the transmitting and receiving wireless devices.

A codeword may be decoded using a list decoder such as a successive cancellation list (SCL) decoder. For example, an SCL decoder may be used for high BLER performance.

However, some polar codes may be non-systematic. In some instances, non-systematic polar codes may not have the same performance (e.g., BER) or unequal error protection (UEP) properties as systematic polar codes. For example, polar codes (e.g., systematic or non-systematic polar coding schemes) may include input bits which may be divided into information bits $u_A$ and frozen bits $u_A c$. An example of the output x for a generator matrix is illustrated below by Equation 8.

$$x = u_A \cdot G_A + u_A c \cdot G_A c = u_A \cdot G_A + c \tag{8}$$

In Equation 8, $c \triangleq u_A c \cdot G_A c$ may be a constant that is known to both the encoder and the decoder. Additionally, $G_A$ may represent the rows from the generator matrix that correspond to the information bits while $G_A c$ may represent the rows from the generator matrix that correspond to the frozen bits.

In some cases, a polar code may be modified to become (e.g., turned into) a systematic polar code. For instance, a wireless communications device may use systematic polar codes (e.g., for XR) for a joint source coding and channel coding solution. The source coding and the channel coding may be designed separately, and then combined using a sorted bit stream. Thus, the source coding and the channel coding may remain separable.

In some cases, a systematic code may include a same quantity of inputs and outputs (e.g., 2 inputs and 2 outputs).

An example of a process (e.g., procedure) to turn a systematic code into a systematic version is shown below with reference to Equations 9 through 11.

$$x_B = u_A \cdot G_{AB} + u_{A^c} \cdot G_{A^cB} \tag{9}$$

$$x_{B^c} = u_A \cdot G_{AB^c} + U_{A^c} \cdot G_{A^cB^c} \tag{10}$$

$$u_A = (x_B - u_{A^c} \cdot G_{A^cB}) \cdot (G_{AB})^{-1} \tag{11}$$

In the above equations, B may represent a subset (e.g., a first arbitrary subset of the information bits) and A may represent another subset (e.g., a second arbitrary subset of the information bits). The sizes of A and B may be the same (e.g., B=A). Thus, $G_{AB}$ may represent an invertible matrix (e.g., if B=A).

As illustrated in Equation 11, the encoding scheme 200 may use information $x_B$ in place of (e.g., in the role of) $u_A$ ($u_A$ as used in Equation 8). That is $x_B$ may represent the information bits and us may represent the input bits (e.g., encoder input bits). Similarly, the encoding scheme 200 may use frozen bits $x_{B^c}$ in the role of $u_{A^c}$ ($u_A C$ as used in Equation 8). In some cases, an encoding scheme 200 that uses systematic polar codes may result in similar (e.g., same) BLER performance and an improved (e.g., better) performance in terms of BER.

As described herein, systematic polar codes may be used for the transmission of information bits in such a way that protects the relatively most important bits of a data stream (e.g., an XR or other video stream). For example, information bits of a data stream may be sorted based on priority or importance. Additionally, in accordance with the use of systematic polar coding, bit-channels may be sorted by protection level, and the sorted bits may be mapped to the most highly protected bit-channels (e.g., based on the importance of the bits). The mapped bits may be encoded using a systematic polar encoder to generate a codeword, and the codeword may be transmitted to another wireless communications device.

Figure 3:
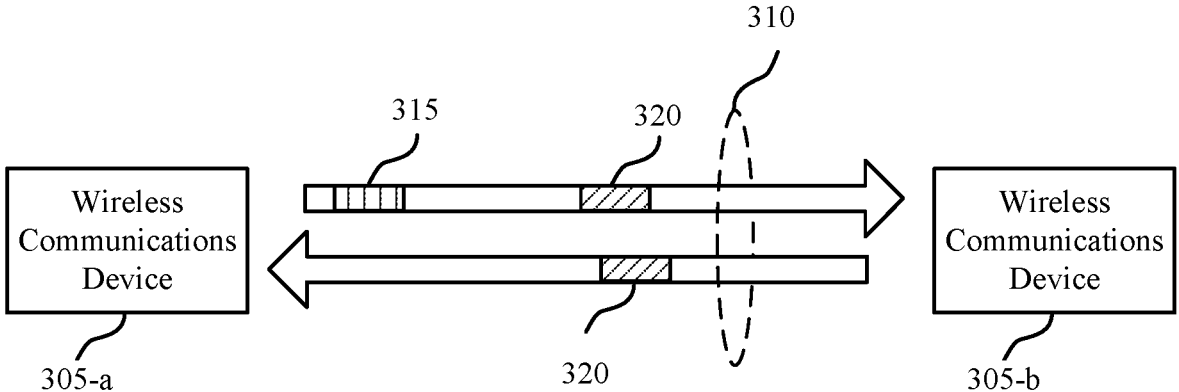
FIG. 3 shows an example of an encoding scheme that supports unequal error protection using systematic polar codes in accordance with one or more aspects of the present disclosure.

FIG. 3 shows an example of a wireless communications system 300 that supports unequal error protection using systematic polar codes in accordance with one or more aspects of the present disclosure. In some examples, the wireless communications system 300 may implement or may be implemented by aspects of wireless communications system 100 or the encoding scheme 200.

The wireless communications system 300 may include a first wireless communications device 305-*a* and a second wireless communications device 305-*b*, which may be examples of UEs 115 and/or network entities 105, as described with reference to FIG. 1. The first wireless communications device 305-*a* and the second wireless communications device 305-*b* may communicate via a communication link 310. For example, the communication link 310 may be an example of a communication link 125 or a communication link 135 as described with reference to FIG. 1. For example, in a downlink scenario, the first wireless communications device 305-*a* may be a network entity 105 and the second wireless communications device 305-*b* may be a UE 115. As another example, in an uplink scenario, the second wireless communications device 305-*b* may be a network entity 105 and the first wireless communications device 305-*a* may be a UE 115. As another example, in a sidelink scenario, the first wireless communications device 305-*a* and the second wireless communications device 305-*b* may both be UEs 115.

The first wireless communications device 305-*a* may transmit a codeword 315 to the second wireless communications device 305-*b*. The codeword may include XR data, data for a video stream, or data for some other application (such as an online video application). As described herein, in XR and other video applications, certain bits or groups of information bits may have a relatively higher priority than other bits. Accordingly, the codeword 315 may be encoded by the first wireless communications device 305-*a* using a systematic polar coding scheme that provides unequal protection to information bits of the XR stream or video stream. For example, DC and lower frequency elements of a video stream may be more important to a viewer's perception than AC and higher frequency elements. Accordingly, the more important information bits of the XR stream or video stream (e.g., for user perception) may be mapped to the most highly protected bit-channels of a systematic polar encoder. Use of systematic polar coding with unequal protection based on the relative importance of bits may provide advantages such as decreased latency, graceful degradation of video quality, and coding gains associated with polar codes. Additionally, the use of systematic polar coding with unequal protection based on the relative importance of bits may improve BER performance and enhance UEP properties.

In some examples, the first wireless communications device 305-*a* and the second wireless communications device 305-*b* may communicate an indication 320 of or may negotiate the mapping scheme used to map more important information bits of the XR stream or video stream to the most protected bit-channels of the polar encoder. Accordingly, after decoding the codeword 315 (e.g., using a list decoder), the second wireless communications device 305-*b* may reorder the decoded bits using the mapping scheme in order to reconstruct the XR stream or video stream. In some examples, the mapping scheme may be predefined (e.g., standardized), and accordingly known to both the first wireless communications device 305-*a* and the second wireless communications device 305-*b*.

Figure 4:
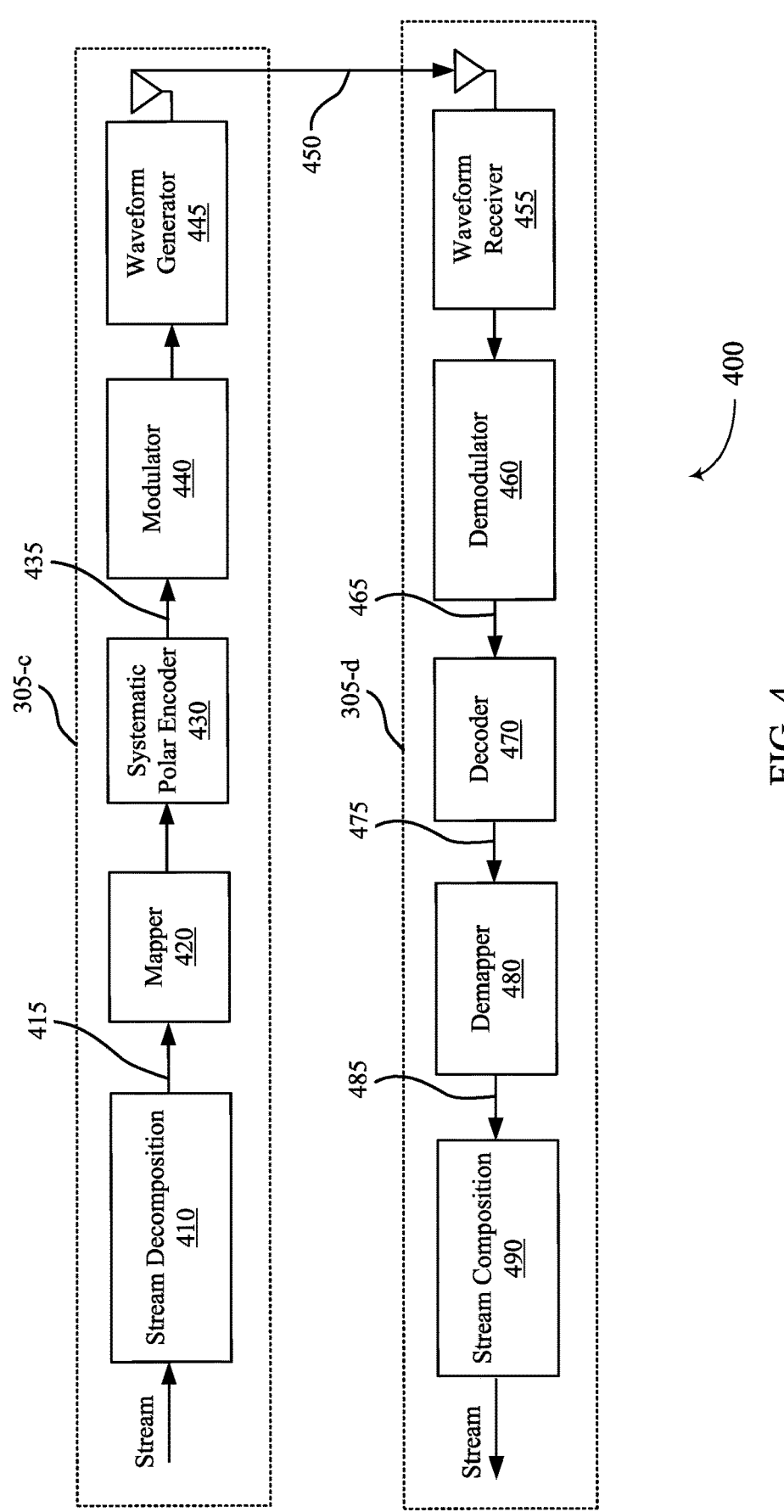
FIG. 4 shows an example of a wireless communications system that supports unequal error protection using systematic polar codes in accordance with one or more aspects of the present disclosure.

FIG. 4 shows an example of a wireless communications system 400 that supports unequal error protection using systematic polar codes in accordance with one or more aspects of the present disclosure. In some examples, the wireless communications system 400 may implement or may be implemented by aspects of wireless communications system 100, the encoding scheme 200, or the wireless communications system 300.

The wireless communications system 400 may include a first wireless communications device 305-*c* and a second wireless communications device 305-*d*, which may be examples of wireless communications devices 305 (e.g., a UE 115, a network entity 105), as described herein.

The first wireless communications device 305-*c* may transmit a codeword 435 to the second wireless communications device 305-*d*. The codeword 435 may include XR data or data for a video stream. As described herein, in XR and other video applications, certain bits or groups of information bits may have a higher priority than other bits. Accordingly, the codeword 435 may be encoded by the first wireless communications device 305-*c* using a systematic polar coding scheme that provides unequal protection to information bits of the XR stream or video stream. For example, DC and lower frequency elements of a video stream may be more important to a viewer's perception than AC and higher frequency elements. Accordingly, the more important information bits of the XR stream or video stream (e.g., for user perception) may be mapped to the most reliable bit-channels of a polar encoder. Use of systematic polar coding with unequal protection (e.g., providing different levels of code protection based on elements of the video stream) may provide advantages such as decreased latency (e.g., due to absence of HARQ and a regular video encoder), power reduction (e.g., due to the absence of a regular video encoder), graceful degradation of video quality (e.g., DC and low frequencies may be decoded at low SNRs and higher frequency and AC components may be decodable at higher SNRs), and coding gains associated with systematic polar codes (which are unavailable in analog modulation).

The first wireless communications device 305-c may transmit XR data or a video stream to the second wireless communications device 305-d using systematic polar encoding. For example, a data stream, such as an XR data stream or a video stream may be received at the first wireless communications device 305-c from a video encoder. The data stream may be in the form of information bits. In other words, the first wireless communications device 305-c may receive information bits for transmission to the second wireless communications device 305-d.

In some cases, a stream decomposition component 410 may sort input bits 415 of the data stream by priority (e.g., bit by bit or by groups of bits). The input bits 415 may be a function of the information bits and frozen bits. For example, the stream decomposition component 410 may sort elements of the data stream based on an importance metric (e.g., DC and lower frequencies may be more important in terms of human visual perception). A rate R may be selected for a systematic polar encoder 430 based on the channel capacity (e.g., the capacity of the channel for the communication link 310 of FIG. 3) and the acceptable BER. If R is above the channel capacity, some data may be lost, and if R is much below the channel capacity, the rate may be lower and less data may be transmitted. For instance, if R is above the channel capacity a message may not be received successfully. Otherwise, if R is below the channel capacity, a message may be successfully received, but may be an inefficient use of resources (e.g., the message contains less bits than a quantity of bits that would have been successfully received).

In some cases, a mapper 420 may match (e.g., map) the sorted input bits 415 to sorted bit-channels of the systematic polar encoder 430 (e.g., the most important bits may be mapped to the most highly protected bit-channels). The bit-channels of the systematic polar encoder 430 may include at least a first and a second subset of information bit-channels. The first subset of bit-channels may include information bit-channels while the second subset of bit-channels may include frozen bit-channels. In some instances, the mapper 420 may map the sorted input bits 415 to the first subset of bit-channels. For example, the most important information bit (e.g., bit with the highest priority) of the sorted input bits 415 may be mapped to the most highly protected bit-channel (e.g., of the first subset of bit-channels).

In some cases, the mapped input bits may be encoded using the systematic polar encoder 430 using the selected rate R to generate a codeword 435. In some examples, the CRC and encryption may be added to the codeword (or some portion of the codeword 435, such as based on the most important portions of the codeword for user perception). For example, the first wireless communications device 305-c may append CRC bits to the codeword (e.g., the input bits) and encrypt the codeword. The codeword 435 may be modulated by a modulator 440 (e.g., quadrature amplitude modulation) and processed by a waveform generator 445

(e.g., an inverse fast Fourier transform (iFFT)) to generate a waveform 450, which may be transmitted to the second wireless communications device 305-d.

The second wireless communications device 305-d may receive the waveform 450 via a waveform receiver 455 (e.g., perform a fast Fourier transform (FFT) on the waveform 450) and may demodulate the output of the waveform receiver 455 via a demodulator 460 to extract to a codeword 465 from the waveform 450. The second wireless communications device 305-d may decode the codeword 465 using a list decoder 470 to generate a set of bits 475 from the codeword 465. The set of bits 475 may represent a set of information bits based on a mapping between the set of information bits and the set of bits 475. The second wireless communications device 305-d may reorder the set of information bits using a demapper 480 (e.g., based on the mapping scheme used by the mapper 420) to generate an ordered set of information bits 485 that correspond to the set of input bits 415. A stream composition component 490 may reconstruct the data stream using from the ordered set of information bits 485.

From the perspective of the second wireless communications device 305-d, the received BER is representative of the instant channel capacity, and any errors in the ordered set of information bits 485 as compared to the set of input bits 415 are more likely to occur in less important bits (for user perception) due to the sorting in the transmission. For example, less important video elements such as the least significant bits of higher frequencies may have a higher BER that DC elements which are more important for human perception of images.

Channel capacity may vary, and accordingly, working with a single rate R (assuming no retransmissions—otherwise a rateless scheme may be used) may lead to large data loss. BLER is a common performance metric, but depending on the application, BLER may not be a suitable measure (e.g., for human perception of real-time video schemes). For example, another metric such as peak SNR (PSNR) may provide a better metric for human perception of real-time video. Polar codes may be used for BLER reduction purposes, for example, for transmitting errorless information. Polar codes may aim to minimize BLER by looking at the minimal set of $BER_i$, assuming no errors were made in indices before i, which may be an optimal solution for BLER reduction. However, systematic polar codes may improve overall BER performance and UEP properties, while providing similar (e.g., same) BLER reduction, when compared to non-systematic polar codes.

In some examples, the bit-channels that are frozen and unfrozen may be determined in accordance with a cost-function that reduces BER. For example, a possible function may be given by $\widehat{BER} = \Sigma_{i \in Information\ bits} C_i \cdot P_{e,i}$, where C is a weight, and $C_i \geq C_j$ is defined by how important $C_i$ is compared to $C_j$. Such a cost function may be determined per SNR, depending on $C_i$ (e.g., using brute force or an algorithm).

In some examples, the bit-channels that are frozen and unfrozen may be determined based on errors propagating through subsequently indexed bit-channels. For example, for all information bit candidates starting from the last index (N), the index with the lowest error probability, $P_{e,i}$, may be selected. Then restarting from the last index (N), the index with the next lowest error probability may be selected, which may be given by $P_{e,i} \cdot (\Sigma_{j>i,j \in Information\ bits} 1)$, where $\Sigma_{j>i,j \in Information\ bits} 1$, means the quantity of information bits with index>i. Intuitively, BER in smaller indices causes more total BER due to error propagation. Such a process may be repeated N times to determine the frozen and unfrozen bit-channels. In some examples, a metric that better reflects human perception of the data stream may be used to determine which bit-channels are frozen and unfrozen.

In some cases (e.g., for techniques using non-systematic polar codes), the first wireless communications device 305-*c* may map the most important bits to the most reliable indexes after determining which bit-channels are frozen and unfrozen. For instance, the probability of error in an information bit indexed bit-channel i, $\widehat{P_{e,i}}$ Per, may be given by $$\widehat{P_{e,i}} = 1 - \prod_{j=1; j \in Information\ bits}^{i} (1 - P_{e,j}) \cong \sum_{j=1; j \in Information\ bits}^{i} P_{e,j}$$

(using the union bound, which may be a good approximation for small errors in the case that R is close to the channel capacity). Accordingly, the probability of an error in the indexed bit-channel i. $P_{e,i}$, is less than the probability of an error in the indexed bit-channel j, $P_{e,j}$, assuming that i<j. However, when using a systematic polar code (e.g., instead of a non-systematic polar code), the relationship $P_{e,i} < P_{e,j}$ for i<j may hold for an encoder input $X_B$, but not for the information bits $u_A$. Thus, the systematic polar encoder 430 may order (e.g., sort) the $P_{e,i}$ of the information $u_A$ by protection level (e.g., a respective protection level associated with each bit-channel). In other words, each respective protection level may be based on an error probability for each bit-channel. The systematic polar encoder 430 may sort the bit-channels by using a Monte-Carlo simulation, a Density Evolution (e.g., when given the code construction), among other examples.

Figure 5:
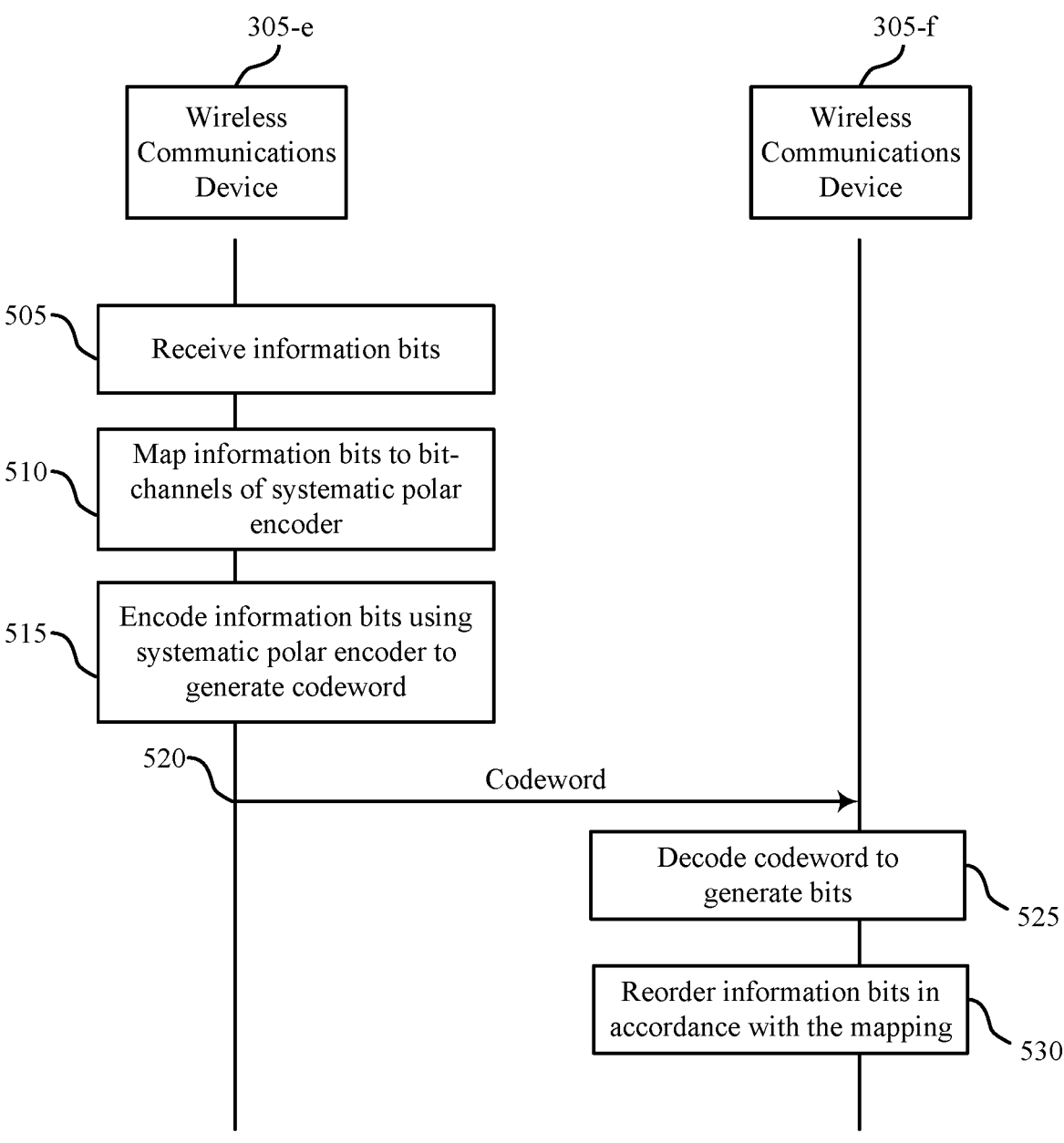
FIG. 5 shows an example of a process flow that supports unequal error protection using systematic polar codes in accordance with one or more aspects of the present disclosure.

FIG. 5 shows an example of a process flow 500 that supports unequal error protection using systematic polar codes in accordance with one or more aspects of the present disclosure. The process flow 500 may implement, or be implemented by, aspects of the wireless communications system 100, the encoding scheme 200, the wireless communications system 300, or the wireless communications system 400. The process flow 500 may include a first wireless communications device 305-*e* and a second wireless communications device 305-*f*, which may be examples of wireless communications devices 305 as described herein. In the following description of the process flow 500, the operations between the first wireless communications device 305-*e* and the second wireless communications device 305-*f* may be transmitted in a different order than the example order shown, or the operations performed by the first wireless communications device 305-*e* and the second wireless communications device 305-*f* may be performed in different orders or at different times. Some operations may also be omitted from the process flow 500, and other operations may be added to the process flow 500.

At 505, the first wireless communications device 305-*e* may receive a set of multiple information bits for transmission to the second wireless communications device 305-*f*. In some examples, the set of multiple information bits may be a stream of XR video data. The set of multiple information bits may be associated with one or more applications (e.g., real-time video, real-time audio, or the like) that operate in accordance with one or more BER parameters. Additionally, a set of multiple input bits may represent the set of multiple information bits based on a mapping between the information bits and the input bits.

At 510, the first wireless communications device 305-*e* may map the set of multiple input bits to a set of multiple bit-channels of a systematic polar encoder based on respective priorities (e.g., importance) of the set of multiple input bits and based on respective protection levels of the set of multiple bit-channels. The mapping of the set of multiple input bits to the set of multiple bit-channels may be predefined or preconfigured. In some examples, the first wireless communications device 305-*c* may communicate an indication of the mapping between the set of multiple input bits and the set of multiple bit-channels with the second wireless communications device 305-*f*.

In some cases, the first wireless communications device 305-*e* may map the set of multiple input bits to a first subset of bit-channels of the set of multiple bit-channels, where the first subset of bit-channels are information bit-channels, and a second subset of bit-channels of the set of multiple bit-channels are frozen bit-channels. In some examples, the first wireless communications device 305-*e* may determine the first subset of bit-channels from the set of multiple bit-channels based on a cost-function that reduces bit error rate. For example, the first wireless communications device 305-*e* may identify the first subset of bit-channels based on a weighting applied to respective error probabilities associated with the first subset of bit-channels. The ordering of the bit-channels may be based on an evaluation of a BER associated with each error probability.

In some examples, the first wireless communications device 305-*e* may determine the first subset of bit-channels from the set of multiple bit-channels based on an error probability rate associated with each of the set of multiple bit-channels and respective quantities of subsequently indexed bit-channels of the first subset of bit-channels. For example, the first wireless communications device 305-*e* may identify the first subset of bit-channels based on a threshold error probability and the ordering of the bit-channels is based on an evaluation starting from a last-indexed bit-channel to identify an index associated with the threshold index probability. The subsequently evaluated bit-channels may have indices that are greater than the index associated with the threshold error probability and based on a block length of the systematic polar encoder. In some examples, the first wireless communications device 305-*e* may determine respective protection levels of the first subset of bit-channels, each respective channel quality based on a respective error probability for a respective bit-channel of the first subset of bit-channels and respective error probability rates associated with previously indexed bit-channels of the first subset of bit-channels. In some examples, a ratio between a first quantity of bit-channels of the first subset of bit-channels and a second quantity of bit-channels of the second subset of bit-channels is based at least in part on a channel capacity of a communication channel between the first wireless communications device and the second wireless communications device.

In some examples, the first wireless communications device 305-*e* may determine the respective priorities of the set of multiple information bits based on an information type associated with each information bit of the set of multiple information bits. In some examples, the first wireless communications device 305-*e* may determine the respective priorities of the set of multiple information bits based on respective frequencies associated with the set of multiple information bits. In some examples, the first wireless communications device 305-*e* may determine the respective priorities of the set of multiple information bits based on a first subset of the set of multiple information bits being associated with direct current aspects of a stream of video data and a second subset of the set of multiple information bits being associated with alternating current aspects of the stream of video data. In some examples, the first wireless communications device 305-*e* may determine the respective priorities of the set of multiple information bits based on identifying a most significant bit of the set of multiple information bits and a least significant bit of the set of multiple information bits.

At 515, the first wireless communications device 305-*e* may encode the set of multiple information bits using the systematic polar encoder in accordance with the mapping of the set of multiple input bits to the set of multiple bit-channels to generate a codeword.

At 520, the first wireless communications device 305-*e* may transmit the codeword to the second wireless communications device 305-*f*.

At 525, the second wireless communications device 305-*f* may decode the codeword using a systematic polar decoder to generate a set of multiple bits. In some examples, the set of multiple bits may represent a set of multiple information bits based on a mapping between the set of multiple information bits and the set of multiple bits. In some instances, the set of multiple bits may be ordered according to the set of multiple bit-channels of the systematic polar decoder (e.g., a list decoder).

At 530, the second wireless communications device 305-*f* may reorder the set of multiple information bits based on the mapping of the set of multiple bits and the set of multiple bit-channels. The mapping of the set of multiple bits and the set of multiple bit-channels may be based on respective priorities of the set of multiple information bits and respective protection levels of the set of multiple bit-channels. In some examples, the first wireless communications device 305-*e* may communicate an indication of the mapping between the set of multiple bits and the set of multiple bit-channels with the second wireless communications device 305-*f* (e.g., such that the second wireless communications device 305-*f* may reorder the set of multiple information bits based on the mapping).

Figure 6:
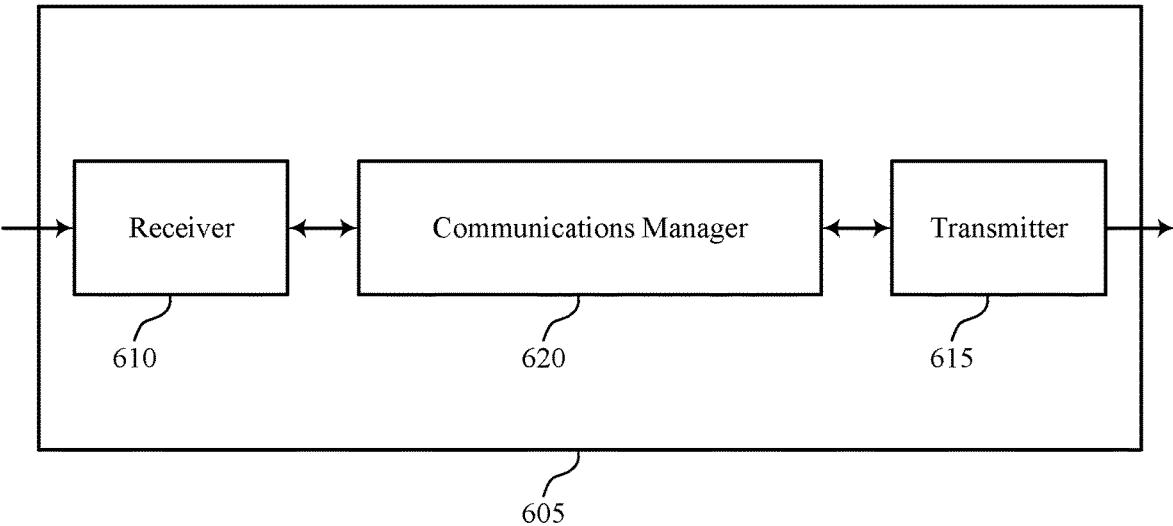
FIGS. 6 and 7 show block diagrams of devices that support unequal error protection using systematic polar codes in accordance with one or more aspects of the present disclosure.
Figure 6:

FIG. 6 shows a block diagram 600 of a device 605 that supports unequal error protection using systematic polar codes in accordance with one or more aspects of the present disclosure. The device 605 may be an example of aspects of a UE 115 or a network entity 105 as described herein. The device 605 may include a receiver 610, a transmitter 615, and a communications manager 620. The device 605, or one or more components of the device 605 (e.g., the receiver 610, the transmitter 615, and the communications manager 620), may include at least one processor, which may be coupled with at least one memory, to, individually or collectively, support or enable the described techniques. Each of these components may be in communication with one another (e.g., via one or more buses).

The receiver 610 may provide a means for receiving information such as packets, user data, control information, or any combination thereof associated with various information channels (e.g., control channels, data channels, information channels related to unequal error protection using systematic polar codes). Information may be passed on to other components of the device 605. The receiver 610 may utilize a single antenna or a set of multiple antennas.

The transmitter 615 may provide a means for transmitting signals generated by other components of the device 605. For example, the transmitter 615 may transmit information such as packets, user data, control information, or any combination thereof associated with various information channels (e.g., control channels, data channels, information channels related to unequal error protection using systematic polar codes). In some examples, the transmitter 615 may be co-located with a receiver 610 in a transceiver module. The transmitter 615 may utilize a single antenna or a set of multiple antennas.

The communications manager 620, the receiver 610, the transmitter 615, or various combinations thereof or various components thereof may be examples of means for performing various aspects of unequal error protection using systematic polar codes as described herein. For example, the communications manager 620, the receiver 610, the transmitter 615, or various combinations or components thereof may be capable of performing one or more of the functions described herein.

In some examples, the communications manager 620, the receiver 610, the transmitter 615, or various combinations or components thereof may be implemented in hardware (e.g., in communications management circuitry). The hardware may include at least one of a processor, a digital signal processor (DSP), a central processing unit (CPU), an application-specific integrated circuit (ASIC), a field-programmable gate array (FPGA) or other programmable logic device, a microcontroller, discrete gate or transistor logic, discrete hardware components, or any combination thereof configured as or otherwise supporting, individually or collectively, a means for performing the functions described in the present disclosure. In some examples, at least one processor and at least one memory coupled with the at least one processor may be configured to perform one or more of the functions described herein (e.g., by one or more processors, individually or collectively, executing instructions stored in the at least one memory).

Additionally, or alternatively, the communications manager 620, the receiver 610, the transmitter 615, or various combinations or components thereof may be implemented in code (e.g., as communications management software or firmware) executed by at least one processor. If implemented in code executed by at least one processor, the functions of the communications manager 620, the receiver 610, the transmitter 615, or various combinations or components thereof may be performed by a general-purpose processor, a DSP, a CPU, an ASIC, an FPGA, a microcontroller, or any combination of these or other programmable logic devices (e.g., configured as or otherwise supporting, individually or collectively, a means for performing the functions described in the present disclosure).

In some examples, the communications manager 620 may be configured to perform various operations (e.g., receiving, obtaining, monitoring, outputting, transmitting) using or otherwise in cooperation with the receiver 610, the transmitter 615, or both. For example, the communications manager 620 may receive information from the receiver 610, send information to the transmitter 615, or be integrated in combination with the receiver 610, the transmitter 615, or both to obtain information, output information, or perform various other operations as described herein.

The communications manager 620 may support wireless communications in accordance with examples as disclosed herein. For example, the communications manager 620 is capable of, configured to, or operable to support a means for receiving a set of multiple information bits for transmission to a second wireless communications device, where a set of multiple input bits represent the set of multiple information bits based on a mapping between the set of multiple information bits and the set of multiple input bits. The communications manager 620 is capable of, configured to, or operable to support a means for mapping the set of multiple input bits to a set of multiple bit channels of a systematic polar encoder based on respective priorities of the set of multiple information bits and respective protection levels of the set of multiple bit channels. The communications manager 620 is capable of, configured to, or operable to support a means for encoding the set of multiple input bits using the systematic polar encoder in accordance with mapping the set of multiple input bits to the set of multiple bit channels to generate a codeword. The communications manager 620 is capable of, configured to, or operable to support a means for transmitting the codeword to the second wireless communications device.

Additionally, or alternatively, the communications manager 620 may support wireless communications in accordance with examples as disclosed herein. For example, the communications manager 620 is capable of, configured to, or operable to support a means for receiving a codeword from a first wireless communications device. The communications manager 620 is capable of, configured to, or operable to support a means for decoding the codeword using a systematic polar decoder to generate a set of multiple bits, where the set of multiple bits represent a set of multiple information bits based on a mapping between the set of multiple information bits and the set of multiple bits, and where the set of multiple bits are ordered in accordance with a set of multiple bit channels. The communications manager 620 is capable of, configured to, or operable to support a means for reordering the set of multiple information bits based on a mapping between of the set of multiple bits and the set of multiple bit channels, the mapping based on respective priorities of the set of multiple information bits and respective protection levels of the set of multiple bit channels.

By including or configuring the communications manager 620 in accordance with examples as described herein, the device 605 (e.g., at least one processor controlling or otherwise coupled with the receiver 610, the transmitter 615, the communications manager 620, or a combination thereof) may support techniques for more efficient utilization of communication resources.

Figure 7:
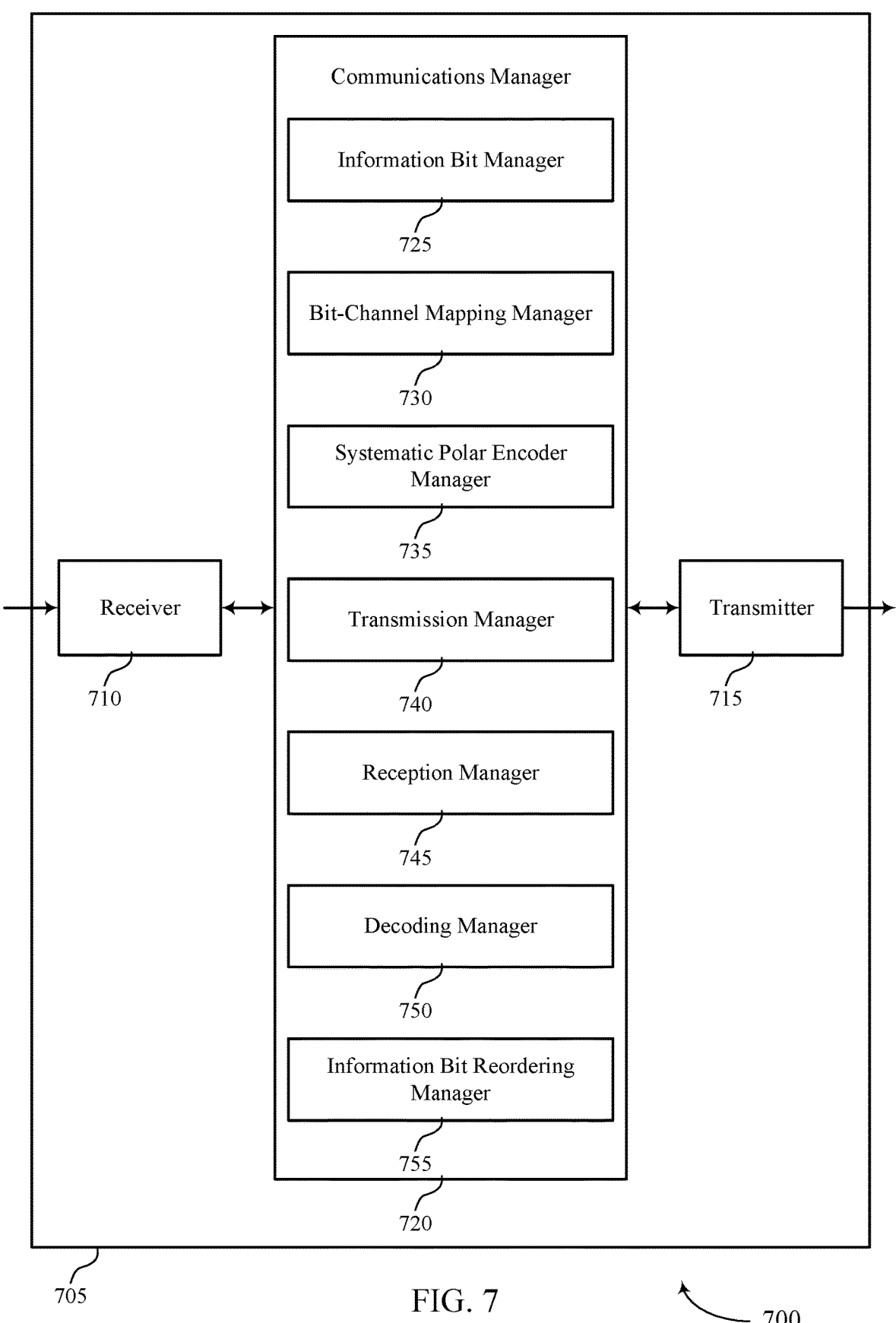

FIG. 7 shows a block diagram 700 of a device 705 that supports unequal error protection using systematic polar codes in accordance with one or more aspects of the present disclosure. The device 705 may be an example of aspects of a device 605, a UE 115, or a network entity 105 as described herein. The device 705 may include a receiver 710, a transmitter 715, and a communications manager 720. The device 705, or one of more components of the device 705 (e.g., the receiver 710, the transmitter 715, and the communications manager 720), may include at least one processor, which may be coupled with at least one memory, to support the described techniques. Each of these components may be in communication with one another (e.g., via one or more buses).

The receiver 710 may provide a means for receiving information such as packets, user data, control information, or any combination thereof associated with various information channels (e.g., control channels, data channels, information channels related to unequal error protection using systematic polar codes). Information may be passed on to other components of the device 705. The receiver 710 may utilize a single antenna or a set of multiple antennas.

The transmitter 715 may provide a means for transmitting signals generated by other components of the device 705. For example, the transmitter 715 may transmit information such as packets, user data, control information, or any combination thereof associated with various information channels (e.g., control channels, data channels, information channels related to unequal error protection using systematic polar codes). In some examples, the transmitter 715 may be co-located with a receiver 710 in a transceiver module. The transmitter 715 may utilize a single antenna or a set of multiple antennas.

The device 705, or various components thereof, may be an example of means for performing various aspects of unequal error protection using systematic polar codes as described herein. For example, the communications manager 720 may include an information bit manager 725, a bit-channel mapping manager 730, a systematic polar encoder manager 735, a transmission manager 740, a reception manager 745, a decoding manager 750, an information bit reordering manager 755, or any combination thereof. The communications manager 720 may be an example of aspects of a communications manager 620 as described herein. In some examples, the communications manager 720, or various components thereof, may be configured to perform various operations (e.g., receiving, obtaining, monitoring, outputting, transmitting) using or otherwise in cooperation with the receiver 710, the transmitter 715, or both. For example, the communications manager 720 may receive information from the receiver 710, send information to the transmitter 715, or be integrated in combination with the receiver 710, the transmitter 715, or both to obtain information, output information, or perform various other operations as described herein.

The communications manager 720 may support wireless communications in accordance with examples as disclosed herein. The information bit manager 725 is capable of, configured to, or operable to support a means for receiving a set of multiple information bits for transmission to a second wireless communications device, where a set of multiple input bits represent the set of multiple information bits based on a mapping between the set of multiple information bits and the set of multiple input bits. The bit-channel mapping manager 730 is capable of, configured to, or operable to support a means for mapping the set of multiple input bits to a set of multiple bit channels of a systematic polar encoder based on respective priorities of the set of multiple information bits and respective protection levels of the set of multiple bit channels. The systematic polar encoder manager 735 is capable of, configured to, or operable to support a means for encoding the set of multiple input bits using the systematic polar encoder in accordance with mapping the set of multiple input bits to the set of multiple bit channels to generate a codeword. The transmission manager 740 is capable of, configured to, or operable to support a means for transmitting the codeword to the second wireless communications device.

Additionally, or alternatively, the communications manager 720 may support wireless communications in accordance with examples as disclosed herein. The reception manager 745 is capable of, configured to, or operable to support a means for receiving a codeword from a first wireless communications device. The decoding manager 750 is capable of, configured to, or operable to support a means for decoding the codeword using a systematic polar decoder to generate a set of multiple bits, where the set of multiple bits represent a set of multiple information bits based on a mapping between the set of multiple information bits and the set of multiple bits, and where the set of multiple bits are ordered in accordance with a set of multiple bit channels. The information bit reordering manager 755 is capable of, configured to, or operable to support a means for reordering the set of multiple information bits based on a mapping between of the set of multiple bits and the set of multiple bit channels, the mapping based on respective priorities of the set of multiple information bits and respective protection levels of the set of multiple bit channels.

Figure 8:
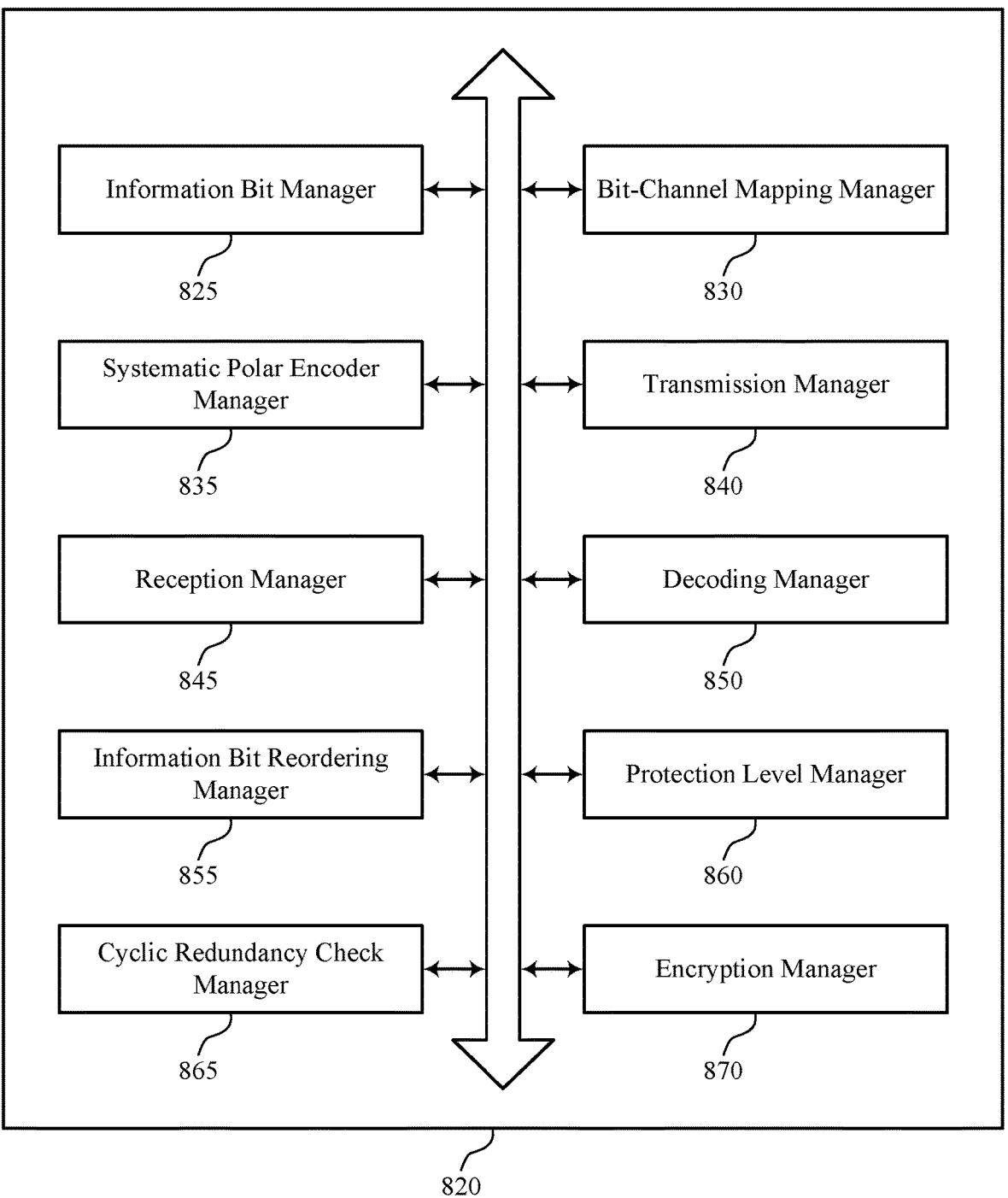
FIG. 8 shows a block diagram of a communications manager that supports unequal error protection using systematic polar codes in accordance with one or more aspects of the present disclosure.

FIG. 8 shows a block diagram 800 of a communications manager 820 that supports unequal error protection using systematic polar codes in accordance with one or more aspects of the present disclosure. The communications manager 820 may be an example of aspects of a communications manager 620, a communications manager 720, or both, as described herein. The communications manager 820, or various components thereof, may be an example of means for performing various aspects of unequal error protection using systematic polar codes as described herein. For example, the communications manager 820 may include an information bit manager 825, a bit-channel mapping manager 830, a systematic polar encoder manager 835, a transmission manager 840, a reception manager 845, a decoding manager 850, an information bit reordering manager 855, a protection level manager 860, a cyclic redundancy check manager 865, an encryption manager 870, or any combination thereof. Each of these components, or components or subcomponents thereof (e.g., one or more processors, one or more memories), may communicate, directly or indirectly, with one another (e.g., via one or more buses) which may include communications within a protocol layer of a protocol stack, communications associated with a logical channel of a protocol stack (e.g., between protocol layers of a protocol stack, within a device, component, or virtualized component associated with a network entity 105, between devices, components, or virtualized components associated with a network entity 105), or any combination thereof.

The communications manager 820 may support wireless communications in accordance with examples as disclosed herein. The information bit manager 825 is capable of, configured to, or operable to support a means for receiving a set of multiple information bits for transmission to a second wireless communications device, where a set of multiple input bits represent the set of multiple information bits based on a mapping between the set of multiple information bits and the set of multiple input bits. The bit-channel mapping manager 830 is capable of, configured to, or operable to support a means for mapping the set of multiple input bits to a set of multiple bit channels of a systematic polar encoder based on respective priorities of the set of multiple information bits and respective protection levels of the set of multiple bit channels. The systematic polar encoder manager 835 is capable of, configured to, or operable to support a means for encoding the set of multiple input bits using the systematic polar encoder in accordance with mapping the set of multiple input bits to the set of multiple bit channels to generate a codeword. The transmission manager 840 is capable of, configured to, or operable to support a means for transmitting the codeword to the second wireless communications device.

In some examples, to support mapping the set of multiple input bits to the set of multiple bit channels, the protection level manager 860 is capable of, configured to, or operable to support a means for determining a first subset of bit channels from the set of multiple bit channels based on a respective protection level for each bit channel of the set of multiple bit channels, the first subset of bit channels including information bit channels, where a second subset of bit channels of the set of multiple bit channels includes frozen bit channels. In some examples, to support mapping the set of multiple input bits to the set of multiple bit channels, the bit-channel mapping manager 830 is capable of, configured to, or operable to support a means for mapping the set of multiple input bits to the first subset of bit channels.

In some examples, the protection level manager 860 is capable of, configured to, or operable to support a means for ordering the first subset of bit channels in accordance with the respective protection levels of the first subset of bit channels, each respective protection level being based on an error probability for each bit channel of the first subset of bit channels, where mapping the set of multiple input bits to the first subset of bit channels is based on ordering the first subset of bit channels.

In some examples, the protection level manager 860 is capable of, configured to, or operable to support a means for identifying the first subset of bit channels based on a weighting applied to respective error probabilities associated with the first subset of bit channels, where the ordering is based on an evaluation of a bit error rate associated with each error probability.

In some examples, the protection level manager 860 is capable of, configured to, or operable to support a means for identifying the first subset of bit channels based on a threshold error probability associated with the set of multiple bit channels, where the ordering is based on an evaluation starting from a last-indexed bit channel of the set of multiple bit channels to identify an index associated with the threshold error probability, and subsequently evaluating bit channels having indices that are greater than the index associated with the threshold error probability and based on a block length of the systematic polar encoder.

In some examples, to support mapping the set of multiple input bits to the set of multiple bit channels, the bit-channel mapping manager 830 is capable of, configured to, or operable to support a means for mapping respective bits of the set of multiple input bits to respective bit channels of the set of multiple bit channels, the respective bits being ordered according to an importance metric for each bit, and the respective bit channels being ordered according to a protection level for each bit channel, where the respective bits are mapped to the respective bit channels based on an ordering of the respective bits and an ordering of the respective bit channels.

In some examples, a ratio between a first quantity of bit channels of the first subset of bit channels and a second quantity of bit channels of the second subset of bit channels is based on a channel capacity of a communication channel between the first wireless communications device and the second wireless communications device.

In some examples, the cyclic redundancy check manager 865 is capable of, configured to, or operable to support a means for appending a set of cyclic redundancy check bits to the set of multiple input bits. In some examples, the encryption manager 870 is capable of, configured to, or operable to support a means for encrypting the codeword, where the codeword transmitted to the second wireless communications device includes the encrypted codeword.

In some examples, the bit-channel mapping manager 830 is capable of, configured to, or operable to support a means for communicating an indication of the mapping between the set of multiple input bits to the set of multiple bit channels with the second wireless communications device.

In some examples, the mapping between the set of multiple input bits to the set of multiple bit channels is predefined or preconfigured.

In some examples, the set of multiple information bits includes a stream of extended reality data.

In some examples, the set of multiple information bits is associated with one or more applications that operate in accordance with one or more bit error rate parameters, the one or more applications being associated with real-time video or real-time audio, or any combination thereof.

Additionally, or alternatively, the communications manager 820 may support wireless communications in accordance with examples as disclosed herein. The reception manager 845 is capable of, configured to, or operable to support a means for receiving a codeword from a first wireless communications device. The decoding manager 850 is capable of, configured to, or operable to support a means for decoding the codeword using a systematic polar decoder to generate a set of multiple bits, where the set of multiple bits represent a set of multiple information bits based on a mapping between the set of multiple information bits and the set of multiple bits, and where the set of multiple bits are ordered in accordance with a set of multiple bit channels. The information bit reordering manager 855 is capable of, configured to, or operable to support a means for reordering the set of multiple information bits based on a mapping between of the set of multiple bits and the set of multiple bit channels, the mapping based on respective priorities of the set of multiple information bits and respective protection levels of the set of multiple bit channels.

In some examples, the set of multiple bit channels includes a first subset of bit channels and a second subset of bit channels, the first subset of bit channels including information bit channels and the second subset of bit channels including frozen bit channels.

In some examples, an order of the first subset of bit channels is in accordance with the respective protection levels of the first subset of bit channels, each respective protection level being based on an error probability for each bit channel of the first subset of bit channels. In some examples, the set of multiple bits are mapped to the first subset of bit channels based on the order of the first subset of bit channels.

In some examples, the respective protection levels of the first subset of bit channels is based on a weighting applied to respective error probabilities associated with the first subset of bit channels. In some examples, the order of the first subset of bit channels is based on an evaluation of a bit error rate associated with each error probability.

In some examples, the respective protection levels of the first subset of bit channels is based on a threshold error probability associated with the set of multiple bit channels. In some examples, the order of the first subset of bit channels is based on an evaluation starting from a last-indexed bit channel of the set of multiple bit channels to identify an index associated with the threshold error probability, and a subsequent evaluation of bit channels having indices that are greater than the index associated with the threshold error probability and based on a block length of the systematic polar decoder.

Figure 9:
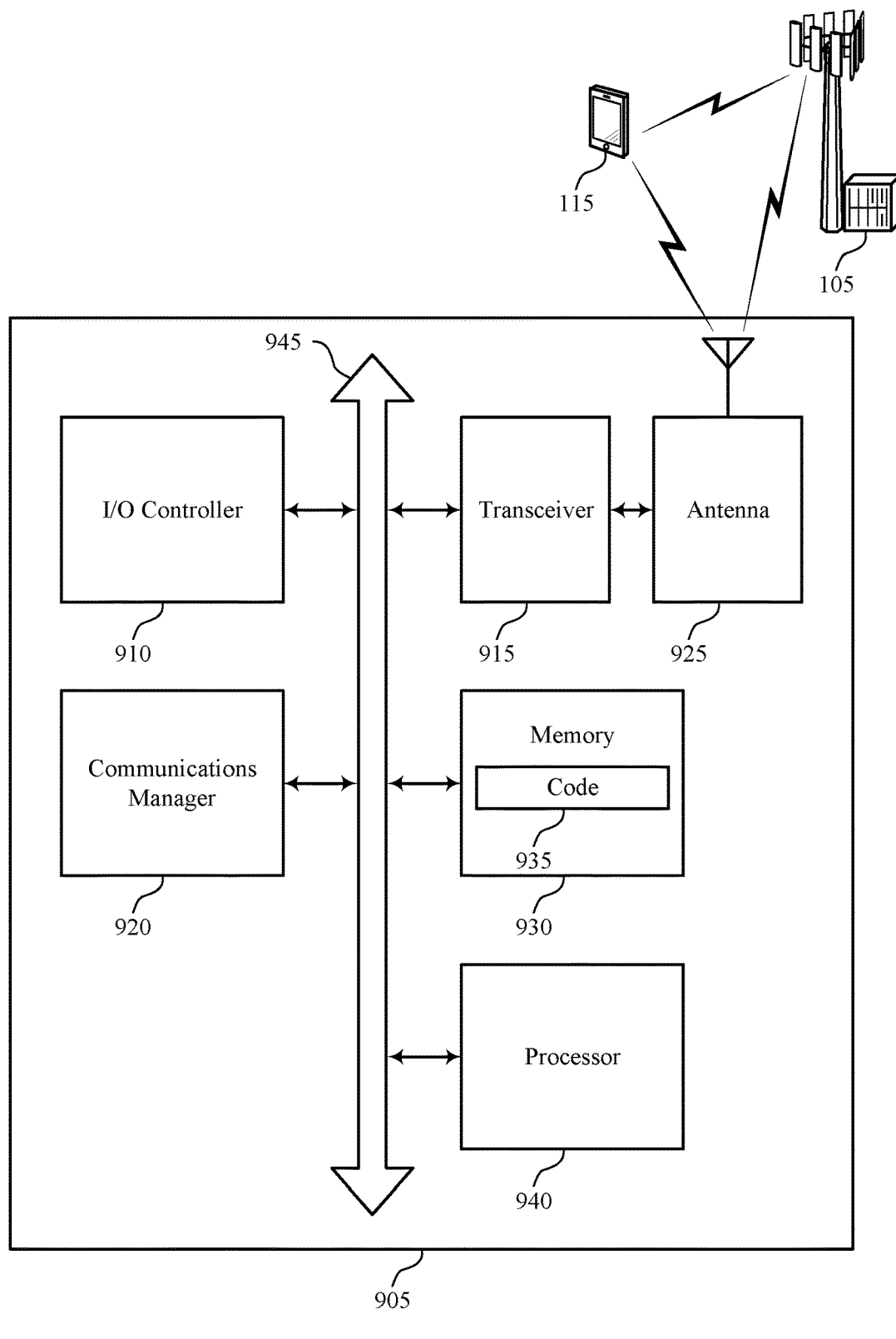
FIG. 9 shows a diagram of a system including a UE that supports unequal error protection using systematic polar codes in accordance with one or more aspects of the present disclosure.

FIG. 9 shows a diagram of a system 900 including a device 905 that supports unequal error protection using systematic polar codes in accordance with one or more aspects of the present disclosure. The device 905 may be an example of or include the components of a device 605, a device 705, or a UE 115 as described herein. The device 905 may communicate (e.g., wirelessly) with one or more network entities 105, one or more UEs 115, or any combination thereof. The device 905 may include components for bi-directional voice and data communications including components for transmitting and receiving communications, such as a communications manager 920, an input/output (I/O) controller 910, a transceiver 915, an antenna 925, at least one memory 930, code 935, and at least one processor 940. These components may be in electronic communication or otherwise coupled (e.g., operatively, communicatively, functionally, electronically, electrically) via one or more buses (e.g., a bus 945).

The I/O controller 910 may manage input and output signals for the device 905. The I/O controller 910 may also manage peripherals not integrated into the device 905. In some cases, the I/O controller 910 may represent a physical connection or port to an external peripheral. In some cases, the I/O controller 910 may utilize an operating system such as iOS®, ANDROID®, MS-DOS®, MS-WINDOWS®, OS/2®, UNIX®, LINUX®, or another known operating system. Additionally, or alternatively, the I/O controller 910 may represent or interact with a modem, a keyboard, a mouse, a touchscreen, or a similar device. In some cases, the I/O controller 910 may be implemented as part of one or more processors, such as the at least one processor 940. In some cases, a user may interact with the device 905 via the I/O controller 910 or via hardware components controlled by the I/O controller 910.

In some cases, the device 905 may include a single antenna 925. However, in some other cases, the device 905 may have more than one antenna 925, which may be capable of concurrently transmitting or receiving multiple wireless transmissions. The transceiver 915 may communicate bi-directionally, via the one or more antennas 925, wired, or wireless links as described herein. For example, the transceiver 915 may represent a wireless transceiver and may communicate bi-directionally with another wireless transceiver. The transceiver 915 may also include a modem to modulate the packets, to provide the modulated packets to one or more antennas 925 for transmission, and to demodulate packets received from the one or more antennas 925. The transceiver 915, or the transceiver 915 and one or more antennas 925, may be an example of a transmitter 615, a transmitter 715, a receiver 610, a receiver 710, or any combination thereof or component thereof, as described herein.

The at least one memory 930 may include random access memory (RAM) and read-only memory (ROM). The at least one memory 930 may store computer-readable, computer-executable code 935 including instructions that, when executed by the at least one processor 940, cause the device 905 to perform various functions described herein. The code 935 may be stored in a non-transitory computer-readable medium such as system memory or another type of memory. In some cases, the code 935 may not be directly executable by the at least one processor 940 but may cause a computer (e.g., when compiled and executed) to perform functions described herein. In some cases, the at least one memory 930 may contain, among other things, a basic I/O system (BIOS) which may control basic hardware or software operation such as the interaction with peripheral components or devices.

The at least one processor 940 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the at least one processor 940 may be configured to operate a memory array using a memory controller. In some other cases, a memory controller may be integrated into the at least one processor 940. The at least one processor 940 may be configured to execute computer-readable instructions stored in a memory (e.g., the at least one memory 930) to cause the device 905 to perform various functions (e.g., functions or tasks supporting unequal error protection using systematic polar codes). For example, the device 905 or a component of the device 905 may include at least one processor 940 and at least one memory 930 coupled with or to the at least one processor 940, the at least one processor 940 and at least one memory 930 configured to perform various functions described herein. In some examples, the at least one processor 940 may include multiple processors and the at least one memory 930 may include multiple memories. One or more of the multiple processors may be coupled with one or more of the multiple memories, which may, individually or collectively, be configured to perform various functions herein. In some examples, the at least one processor 940 may be a component of a processing system, which may refer to a system (such as a series) of machines, circuitry (including, for example, one or both of processor circuitry (which may include the at least one processor 940) and memory circuitry (which may include the at least one memory 930)), or components, that receives or obtains inputs and processes the inputs to produce, generate, or obtain a set of outputs. The processing system may be configured to perform one or more of the functions described herein. As such, the at least one processor 940 or a processing system including the at least one processor 940 may be configured to, configurable to, or operable to cause the device 905 to perform one or more of the functions described herein. Further, as described herein, being "configured to," being "configurable to," and being "operable to" may be used interchangeably and may be associated with a capability, when executing code stored in the at least one memory 930 or otherwise, to perform one or more of the functions described herein.

The communications manager 920 may support wireless communications in accordance with examples as disclosed herein. For example, the communications manager 920 is capable of, configured to, or operable to support a means for receiving a set of multiple information bits for transmission to a second wireless communications device, where a set of multiple input bits represent the set of multiple information bits based on a mapping between the set of multiple information bits and the set of multiple input bits. The communications manager 920 is capable of, configured to, or operable to support a means for mapping the set of multiple input bits to a set of multiple bit channels of a systematic polar encoder based on respective priorities of the set of multiple information bits and respective protection levels of the set of multiple bit channels. The communications manager 920 is capable of, configured to, or operable to support a means for encoding the set of multiple input bits using the systematic polar encoder in accordance with mapping the set of multiple input bits to the set of multiple bit channels to generate a codeword. The communications manager 920 is capable of, configured to, or operable to support a means for transmitting the codeword to the second wireless communications device.

Additionally, or alternatively, the communications manager 920 may support wireless communications in accordance with examples as disclosed herein. For example, the communications manager 920 is capable of, configured to, or operable to support a means for receiving a codeword from a first wireless communications device. The communications manager 920 is capable of, configured to, or operable to support a means for decoding the codeword using a systematic polar decoder to generate a set of multiple bits, where the set of multiple bits represent a set of multiple information bits based on a mapping between the set of multiple information bits and the set of multiple bits, and where the set of multiple bits are ordered in accordance with a set of multiple bit channels. The communications manager 920 is capable of, configured to, or operable to support a means for reordering the set of multiple information bits based on a mapping between of the set of multiple bits and the set of multiple bit channels, the mapping based on respective priorities of the set of multiple information bits and respective protection levels of the set of multiple bit channels.

By including or configuring the communications manager 920 in accordance with examples as described herein, the device 905 may support techniques for improved communication reliability, reduced latency, improved user experience related to reduced processing, more efficient utilization of communication resources, and improved coordination between devices.

In some examples, the communications manager 920 may be configured to perform various operations (e.g., receiving, monitoring, transmitting) using or otherwise in cooperation with the transceiver 915, the one or more antennas 925, or any combination thereof. Although the communications manager 920 is illustrated as a separate component, in some examples, one or more functions described with reference to the communications manager 920 may be supported by or performed by the at least one processor 940, the at least one memory 930, the code 935, or any combination thereof. For example, the code 935 may include instructions executable by the at least one processor 940 to cause the device 905 to perform various aspects of unequal error protection using systematic polar codes as described herein, or the at least one processor 940 and the at least one memory 930 may be otherwise configured to, individually or collectively, perform or support such operations.

Figure 10:
FIG. 10 shows a diagram of a system including a network entity that supports unequal error protection using systematic polar codes in accordance with one or more aspects of the present disclosure.

FIG. 10 shows a diagram of a system 1000 including a device 1005 that supports unequal error protection using systematic polar codes in accordance with one or more aspects of the present disclosure. The device 1005 may be an example of or include the components of a device 605, a device 705, or a network entity 105 as described herein. The device 1005 may communicate with one or more network entities 105, one or more UEs 115, or any combination thereof, which may include communications over one or more wired interfaces, over one or more wireless interfaces, or any combination thereof. The device 1005 may include components that support outputting and obtaining communications, such as a communications manager 1020, a transceiver 1010, an antenna 1015, at least one memory 1025, code 1030, and at least one processor 1035. These components may be in electronic communication or otherwise coupled (e.g., operatively, communicatively, functionally, electronically, electrically) via one or more buses (e.g., a bus 1040).

The transceiver 1010 may support bi-directional communications via wired links, wireless links, or both as described herein. In some examples, the transceiver 1010 may include a wired transceiver and may communicate bi-directionally with another wired transceiver. Additionally, or alternatively, in some examples, the transceiver 1010 may include a wireless transceiver and may communicate bi-directionally with another wireless transceiver. In some examples, the device 1005 may include one or more antennas 1015, which may be capable of transmitting or receiving wireless transmissions (e.g., concurrently). The transceiver 1010 may also include a modem to modulate signals, to provide the modulated signals for transmission (e.g., by one or more antennas 1015, by a wired transmitter), to receive modulated signals (e.g., from one or more antennas 1015, from a wired receiver), and to demodulate signals. In some implementations, the transceiver 1010 may include one or more interfaces, such as one or more interfaces coupled with the one or more antennas 1015 that are configured to support various receiving or obtaining operations, or one or more interfaces coupled with the one or more antennas 1015 that are configured to support various transmitting or outputting operations, or a combination thereof. In some implementations, the transceiver 1010 may include or be configured for coupling with one or more processors or one or more memory components that are operable to perform or support operations based on received or obtained information or signals, or to generate information or other signals for transmission or other outputting, or any combination thereof. In some implementations, the transceiver 1010, or the transceiver 1010 and the one or more antennas 1015, or the transceiver 1010 and the one or more antennas 1015 and one or more processors or one or more memory components (e.g., the at least one processor 1035, the at least one memory 1025, or both), may be included in a chip or chip assembly that is installed in the device 1005. In some examples, the transceiver 1010 may be operable to support communications via one or more communications links (e.g., a communication link 125, a backhaul communication link 120, a midhaul communication link 162, a fronthaul communication link 168).

The at least one memory 1025 may include RAM, ROM, or any combination thereof. The at least one memory 1025 may store computer-readable, computer-executable code 1030 including instructions that, when executed by one or more of the at least one processor 1035, cause the device 1005 to perform various functions described herein. The code 1030 may be stored in a non-transitory computer-readable medium such as system memory or another type of memory. In some cases, the code 1030 may not be directly executable by a processor of the at least one processor 1035 but may cause a computer (e.g., when compiled and executed) to perform functions described herein. In some cases, the at least one memory 1025 may contain, among other things, a BIOS which may control basic hardware or software operation such as the interaction with peripheral components or devices. In some examples, the at least one processor 1035 may include multiple processors and the at least one memory 1025 may include multiple memories. One or more of the multiple processors may be coupled with one or more of the multiple memories which may, individually or collectively, be configured to perform various functions herein (for example, as part of a processing system).

The at least one processor 1035 may include an intelligent hardware device (e.g., a general-purpose processor, a DSP, an ASIC, a CPU, an FPGA, a microcontroller, a programmable logic device, discrete gate or transistor logic, a discrete hardware component, or any combination thereof). In some cases, the at least one processor 1035 may be configured to operate a memory array using a memory controller. In some other cases, a memory controller may be integrated into one or more of the at least one processor 1035. The at least one processor 1035 may be configured to execute computer-readable instructions stored in a memory (e.g., one or more of the at least one memory 1025) to cause the device 1005 to perform various functions (e.g., functions or tasks supporting unequal error protection using systematic polar codes). For example, the device 1005 or a component of the device 1005 may include at least one processor 1035 and at least one memory 1025 coupled with one or more of the at least one processor 1035, the at least one processor 1035 and the at least one memory 1025 configured to perform various functions described herein. The at least one processor 1035 may be an example of a cloud-computing platform (e.g., one or more physical nodes and supporting software such as operating systems, virtual machines, or container instances) that may host the functions (e.g., by executing code 1030) to perform the functions of the device 1005. The at least one processor 1035 may be any one or more suitable processors capable of executing scripts or instructions of one or more software programs stored in the device 1005 (such as within one or more of the at least one memory 1025). In some examples, the at least one processor 1035 may include multiple processors and the at least one memory 1025 may include multiple memories. One or more of the multiple processors may be coupled with one or more of the multiple memories, which may, individually or collectively, be configured to perform various functions herein. In some examples, the at least one processor 1035 may be a component of a processing system, which may refer to a system (such as a series) of machines, circuitry (including, for example, one or both of processor circuitry (which may include the at least one processor 1035) and memory circuitry (which may include the at least one memory 1025)), or components, that receives or obtains inputs and processes the inputs to produce, generate, or obtain a set of outputs. The processing system may be configured to perform one or more of the functions described herein. As such, the at least one processor 1035 or a processing system including the at least one processor 1035 may be configured to, configurable to, or operable to cause the device 1005 to perform one or more of the functions described herein. Further, as described herein, being "configured to," being "configurable to," and being "operable to" may be used interchangeably and may be associated with a capability, when executing code stored in the at least one memory 1025 or otherwise, to perform one or more of the functions described herein.

In some examples, a bus 1040 may support communications of (e.g., within) a protocol layer of a protocol stack. In some examples, a bus 1040 may support communications associated with a logical channel of a protocol stack (e.g., between protocol layers of a protocol stack), which may include communications performed within a component of the device 1005, or between different components of the device 1005 that may be co-located or located in different locations (e.g., where the device 1005 may refer to a system in which one or more of the communications manager 1020, the transceiver 1010, the at least one memory 1025, the code 1030, and the at least one processor 1035 may be located in one of the different components or divided between different components).

In some examples, the communications manager 1020 may manage aspects of communications with a core network 130 (e.g., via one or more wired or wireless backhaul links). For example, the communications manager 1020 may manage the transfer of data communications for client devices, such as one or more UEs 115. In some examples, the communications manager 1020 may manage communications with other network entities 105, and may include a controller or scheduler for controlling communications with UEs 115 in cooperation with other network entities 105. In some examples, the communications manager 1020 may support an X2 interface within an LTE/LTE-A wireless communications network technology to provide communication between network entities 105.

The communications manager 1020 may support wireless communications in accordance with examples as disclosed herein. For example, the communications manager 1020 is capable of, configured to, or operable to support a means for receiving a set of multiple information bits for transmission to a second wireless communications device, where a set of multiple input bits represent the set of multiple information bits based on a mapping between the set of multiple information bits and the set of multiple input bits. The communications manager 1020 is capable of, configured to, or operable to support a means for mapping the set of multiple input bits to a set of multiple bit channels of a systematic polar encoder based on respective priorities of the set of multiple information bits and respective protection levels of the set of multiple bit channels. The communications manager 1020 is capable of, configured to, or operable to support a means for encoding the set of multiple input bits using the systematic polar encoder in accordance with mapping the set of multiple input bits to the set of multiple bit channels to generate a codeword. The communications manager 1020 is capable of, configured to, or operable to support a means for transmitting the codeword to the second wireless communications device.

Additionally, or alternatively, the communications manager 1020 may support wireless communications in accordance with examples as disclosed herein. For example, the communications manager 1020 is capable of, configured to, or operable to support a means for receiving a codeword from a first wireless communications device. The communications manager 1020 is capable of, configured to, or operable to support a means for decoding the codeword using a systematic polar decoder to generate a set of multiple bits, where the set of multiple bits represent a set of multiple information bits based on a mapping between the set of multiple information bits and the set of multiple bits, and where the set of multiple bits are ordered in accordance with a set of multiple bit channels. The communications manager 1020 is capable of, configured to, or operable to support a means for reordering the set of multiple information bits based on a mapping between of the set of multiple bits and the set of multiple bit channels, the mapping based on respective priorities of the set of multiple information bits and respective protection levels of the set of multiple bit channels.

By including or configuring the communications manager 1020 in accordance with examples as described herein, the device 1005 may support techniques for improved communication reliability, reduced latency, improved user experience related to reduced processing, more efficient utilization of communication resources, and improved coordination between devices.

In some examples, the communications manager 1020 may be configured to perform various operations (e.g., receiving, obtaining, monitoring, outputting, transmitting) using or otherwise in cooperation with the transceiver 1010, the one or more antennas 1015 (e.g., where applicable), or any combination thereof. Although the communications manager 1020 is illustrated as a separate component, in some examples, one or more functions described with reference to the communications manager 1020 may be supported by or performed by the transceiver 1010, one or more of the at least one processor 1035, one or more of the at least one memory 1025, the code 1030, or any combination thereof (for example, by a processing system including at least a portion of the at least one processor 1035, the at least one memory 1025, the code 1030, or any combination thereof). For example, the code 1030 may include instructions executable by one or more of the at least one processor 1035 to cause the device 1005 to perform various aspects of unequal error protection using systematic polar codes as described herein, or the at least one processor 1035 and the at least one memory 1025 may be otherwise configured to, individually or collectively, perform or support such operations.

FIG. 11 shows a flowchart illustrating a method 1100 that supports unequal error protection using systematic polar codes in accordance with aspects of the present disclosure. The operations of the method 1100 may be implemented by a UE or a network entity or its components as described herein. For example, the operations of the method 1100 may be performed by a UE 115 or a network entity as described with reference to FIGS. 1 through 10. In some examples, a UE or a network entity may execute a set of instructions to control the functional elements of the UE or the network entity to perform the described functions. Additionally, or alternatively, the UE or the network entity may perform aspects of the described functions using special-purpose hardware.

At 1105, the method may include receiving a set of multiple information bits for transmission to a second wireless communications device, where a set of multiple input bits represent the set of multiple information bits based on a mapping between the set of multiple information bits and the set of multiple input bits. The operations of 1105 may be performed in accordance with examples as disclosed herein. In some examples, aspects of the operations of 1105 may be performed by an information bit manager 825 as described with reference to FIG. 8.

At 1110, the method may include mapping the set of multiple input bits to a set of multiple bit channels of a systematic polar encoder based on respective priorities of the set of multiple information bits and respective protection levels of the set of multiple bit channels. The operations of 1110 may be performed in accordance with examples as disclosed herein. In some examples, aspects of the operations of 1110 may be performed by a bit-channel mapping manager 830 as described with reference to FIG. 8.

At 1115, the method may include encoding the set of multiple input bits using the systematic polar encoder in accordance with mapping the set of multiple input bits to the set of multiple bit channels to generate a codeword. The operations of 1115 may be performed in accordance with examples as disclosed herein. In some examples, aspects of the operations of 1115 may be performed by a systematic polar encoder manager 835 as described with reference to FIG. 8.

At 1120, the method may include transmitting the codeword to the second wireless communications device. The operations of 1120 may be performed in accordance with examples as disclosed herein. In some examples, aspects of the operations of 1120 may be performed by a transmission manager 840 as described with reference to FIG. 8.

FIG. 12 shows a flowchart illustrating a method 1200 that supports unequal error protection using systematic polar codes in accordance with aspects of the present disclosure. The operations of the method 1200 may be implemented by a UE or a network entity or its components as described herein. For example, the operations of the method 1200 may be performed by a UE 115 or a network entity as described with reference to FIGS. 1 through 10. In some examples, a UE or a network entity may execute a set of instructions to control the functional elements of the UE or the network entity to perform the described functions. Additionally, or alternatively, the UE or the network entity may perform aspects of the described functions using special-purpose hardware.

At 1205, the method may include receiving a codeword from a first wireless communications device. The operations of 1205 may be performed in accordance with examples as disclosed herein. In some examples, aspects of the operations of 1205 may be performed by a reception manager 845 as described with reference to FIG. 8.

At 1210, the method may include decoding the codeword using a systematic polar decoder to generate a set of multiple bits, where the set of multiple bits represent a set of multiple information bits based on a mapping between the set of multiple information bits and the set of multiple bits, and where the set of multiple bits are ordered in accordance with a set of multiple bit channels. The operations of 1210 may be performed in accordance with examples as disclosed herein. In some examples, aspects of the operations of 1210 may be performed by a decoding manager 850 as described with reference to FIG. 8.

At 1215, the method may include reordering the set of multiple information bits based on a mapping between of the set of multiple bits and the set of multiple bit channels, the mapping based on respective priorities of the set of multiple information bits and respective protection levels of the set of multiple bit channels. The operations of 1215 may be performed in accordance with examples as disclosed herein. In some examples, aspects of the operations of 1215 may be performed by an information bit reordering manager 855 as described with reference to FIG. 8.

The Following Provides an Overview of Aspects of the Present Disclosure:

Aspect 1: A method for wireless communications at a first wireless communications device, comprising: receiving a plurality of information bits for transmission to a second wireless communications device, wherein a plurality of input bits represent the plurality of information bits based at least in part on a mapping between the plurality of information bits and the plurality of input bits; mapping the plurality of input bits to a plurality of bit channels of a systematic polar encoder based at least in part on respective priorities of the plurality of information bits and respective protection levels of the plurality of bit channels; encoding the plurality of input bits using the systematic polar encoder in accordance with mapping the plurality of input bits to the plurality of bit channels to generate a codeword; and transmitting the codeword to the second wireless communications device.

Aspect 2: The method of aspect 1, wherein mapping the plurality of input bits to the plurality of bit channels comprises: determining a first subset of bit channels from the plurality of bit channels based at least in part on a respective protection level for each bit channel of the plurality of bit channels, the first subset of bit channels comprising information bit channels, wherein a second subset of bit channels of the plurality of bit channels comprises frozen bit channels; and mapping the plurality of input bits to the first subset of bit channels.

Aspect 3: The method of aspect 2, further comprising: ordering the first subset of bit channels in accordance with the respective protection levels of the first subset of bit channels, each respective protection level being based at least in part on an error probability for each bit channel of the first subset of bit channels, wherein mapping the plurality of input bits to the first subset of bit channels is based at least in part on ordering the first subset of bit channels.

Aspect 4: The method of aspect 3, further comprising: identifying the first subset of bit channels based at least in part on a weighting applied to respective error probabilities associated with the first subset of bit channels, wherein the ordering is based at least in part on an evaluation of a bit error rate associated with each error probability.

Aspect 5: The method of aspect 3, further comprising: identifying the first subset of bit channels based at least in part on a threshold error probability associated with the plurality of bit channels, wherein the ordering is based at least in part on an evaluation starting from a last-indexed bit channel of the plurality of bit channels to identify an index associated with the threshold error probability, and subsequently evaluating bit channels having indices that are greater than the index associated with the threshold error probability and based at least in part on a block length of the systematic polar encoder.

Aspect 6: The method of any of aspects 2 through 5, wherein mapping the plurality of input bits to the plurality of bit channels comprises: mapping respective bits of the plurality of input bits to respective bit channels of the plurality of bit channels, the respective bits being ordered according to an importance metric for each bit, and the respective bit channels being ordered according to a protection level for each bit channel, wherein the respective bits are mapped to the respective bit channels based at least in part on an ordering of the respective bits and an ordering of the respective bit channels.

Aspect 7: The method of any of aspects 2 through 6, wherein a ratio between a first quantity of bit channels of the first subset of bit channels and a second quantity of bit channels of the second subset of bit channels is based at least in part on a channel capacity of a communication channel between the first wireless communications device and the second wireless communications device.

Aspect 8: The method of any of aspects 1 through 7, further comprising: appending a set of cyclic redundancy check bits to the plurality of input bits; and encrypting the codeword, wherein the codeword transmitted to the second wireless communications device comprises the encrypted codeword.

Aspect 9: The method of any of aspects 1 through 8, further comprising: communicating an indication of the mapping between the plurality of input bits to the plurality of bit channels with the second wireless communications device.

Aspect 10: The method of any of aspects 1 through 9, wherein the mapping between the plurality of input bits to the plurality of bit channels is predefined or preconfigured.

Aspect 11: The method of any of aspects 1 through 10, wherein the plurality of information bits comprises a stream of extended reality data.

Aspect 12: The method of any of aspects 1 through 11, wherein the plurality of information bits is associated with one or more applications that operate in accordance with one or more bit error rate parameters, the one or more applications being associated with real-time video or real-time audio, or any combination thereof.

Aspect 13: A method for wireless communications at a second wireless communications device, comprising: receiving a codeword from a first wireless communications device; decoding the codeword using a systematic polar decoder to generate a plurality of bits, wherein the plurality of bits represent a plurality of information bits based at least in part on a mapping between the plurality of information bits and the plurality of bits, and wherein the plurality of bits are ordered in accordance with a plurality of bit channels; and reordering the plurality of information bits based at least in part on a mapping between of the plurality of bits and the plurality of bit channels, the mapping based at least in part on respective priorities of the plurality of information bits and respective protection levels of the plurality of bit channels.

Aspect 14: The method of aspect 13, wherein the plurality of bit channels includes a first subset of bit channels and a second subset of bit channels, the first subset of bit channels comprising information bit channels and the second subset of bit channels comprising frozen bit channels.

Aspect 15: The method of aspect 14, wherein an order of the first subset of bit channels is in accordance with the respective protection levels of the first subset of bit channels, each respective protection level being based at least in part on an error probability for each bit channel of the first subset of bit channels, the plurality of bits are mapped to the first subset of bit channels based at least in part on the order of the first subset of bit channels.

Aspect 16: The method of any of aspects 14 through 15, wherein the respective protection levels of the first subset of bit channels is based at least in part on a weighting applied to respective error probabilities associated with the first subset of bit channels, the order of the first subset of bit channels is based at least in part on an evaluation of a bit error rate associated with each error probability.

Aspect 17: The method of any of aspects 14 through 15, wherein the respective protection levels of the first subset of bit channels is based at least in part on a threshold error probability associated with the plurality of bit channels, and the order of the first subset of bit channels is based at least in part on an evaluation starting from a last-indexed bit channel of the plurality of bit channels to identify an index associated with the threshold error probability, and a subsequent evaluation of bit channels having indices that are greater than the index associated with the threshold error probability and based at least in part on a block length of the systematic polar decoder.

Aspect 18: A first wireless communications device for wireless communications, comprising one or more memories storing processor-executable code, and one or more processors coupled with the one or more memories and individually or collectively operable to execute the code to cause the first wireless communications device to perform a method of any of aspects 1 through 12.

Aspect 19: A first wireless communications device for wireless communications, comprising at least one means for performing a method of any of aspects 1 through 12.

Aspect 20: A non-transitory computer-readable medium storing code for wireless communications, the code comprising instructions executable by one or more processors to perform a method of any of aspects 1 through 12.

Aspect 21: A second wireless communications device for wireless communications, comprising one or more memories storing processor-executable code, and one or more processors coupled with the one or more memories and individually or collectively operable to execute the code to cause the second wireless communications device to perform a method of any of aspects 13 through 17.

Aspect 22: A second wireless communications device for wireless communications, comprising at least one means for performing a method of any of aspects 13 through 17.

Aspect 23: A non-transitory computer-readable medium storing code for wireless communications, the code comprising instructions executable by one or more processors to perform a method of any of aspects 13 through 17.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed using a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor but, in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration). Any functions or operations described herein as being capable of being performed by a processor may be performed by multiple processors that, individually or collectively, are capable of performing the described functions or operations.

The functions described herein may be implemented using hardware, software executed by a processor, firmware, or any combination thereof. If implemented using software executed by a processor, the functions may be stored as or transmitted using one or more instructions or code of a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one location to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc. Disks may reproduce data magnetically, and discs may reproduce data optically using lasers. Combinations of the above are also included within the scope of computer-readable media. Any functions or operations described herein as being capable of being performed by a memory may be performed by multiple memories that, individually or collectively, are capable of performing the described functions or operations.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

As used herein, including in the claims, the article "a" before a noun is open-ended and understood to refer to "at least one" of those nouns or "one or more" of those nouns. Thus, the terms "a," "at least one," "one or more," "at least one of one or more" may be interchangeable. For example, if a claim recites "a component" that performs one or more functions, each of the individual functions may be performed by a single component or by any combination of multiple components. Thus, the term "a component" having characteristics or performing functions may refer to "at least one of one or more components" having a particular characteristic or performing a particular function. Subsequent reference to a component introduced with the article "a" using the terms "the" or "said" may refer to any or all of the one or more components. For example, a component introduced with the article "a" may be understood to mean "one or more components," and referring to "the component" subsequently in the claims may be understood to be equivalent to referring to "at least one of the one or more components." Similarly, subsequent reference to a component introduced as "one or more components" using the terms "the" or "said" may refer to any or all of the one or more components. For example, referring to "the one or more components" subsequently in the claims may be understood to be equivalent to referring to "at least one of the one or more components."

The term "determine" or "determining" encompasses a variety of actions and, therefore, "determining" can include calculating, computing, processing, deriving, investigating, looking up (such as via looking up in a table, a database or another data structure), ascertaining and the like. Also, "determining" can include receiving (e.g., receiving information), accessing (e.g., accessing data stored in memory)

and the like. Also, "determining" can include resolving, obtaining, selecting, choosing, establishing, and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A first wireless communications device, comprising:
   one or more memories storing processor-executable code; and
   one or more processors coupled with the one or more memories and individually or collectively operable to execute the code to cause the first wireless communications device to:
   receive a plurality of information bits for transmission to a second wireless communications device, wherein a plurality of input bits represent the plurality of information bits based at least in part on a mapping between the plurality of information bits and the plurality of input bits;
   map the plurality of input bits to a plurality of bit channels of a systematic polar encoder based at least in part on respective priorities of the plurality of information bits and respective protection levels of the plurality of bit channels, wherein information bits of the plurality of information bits that have a higher priority correspond to bit channels of the plurality of bit channels that have a higher protection level in accordance with the mapping;
   encode the plurality of input bits using the systematic polar encoder in accordance with mapping the plurality of input bits to the plurality of bit channels to generate a single codeword corresponding to the plurality of information bits; and
   transmit the single codeword to the second wireless communications device.

2. The first wireless communications device of claim 1, wherein, to map the plurality of input bits to the plurality of bit channels, the one or more processors are individually or collectively operable to execute the code to cause the first wireless communications device to:

determine a first subset of bit channels from the plurality of bit channels based at least in part on a respective protection level for each bit channel of the plurality of bit channels, the first subset of bit channels comprising information bit channels, wherein a second subset of bit channels of the plurality of bit channels comprises frozen bit channels; and map the plurality of input bits to the first subset of bit channels.

3. The first wireless communications device of claim 2, wherein the one or more processors are individually or collectively further operable to execute the code to cause the first wireless communications device to:

order the first subset of bit channels in accordance with the respective protection levels of the first subset of bit channels, each respective protection level being based at least in part on an error probability for each bit channel of the first subset of bit channels, wherein mapping the plurality of input bits to the first subset of bit channels is based at least in part on ordering the first subset of bit channels.

4. The first wireless communications device of claim 3, wherein the one or more processors are individually or collectively further operable to execute the code to cause the first wireless communications device to:

identify the first subset of bit channels based at least in part on a weighting applied to respective error probabilities associated with the first subset of bit channels, wherein the ordering is based at least in part on an evaluation of a bit error rate associated with each error probability.

5. The first wireless communications device of claim 3, wherein the one or more processors are individually or collectively further operable to execute the code to cause the first wireless communications device to:

identify the first subset of bit channels based at least in part on a threshold error probability associated with the plurality of bit channels, wherein the ordering is based at least in part on an evaluation starting from a last-indexed bit channel of the plurality of bit channels to identify an index associated with the threshold error probability, and subsequently evaluating bit channels having indices that are greater than the index associated with the threshold error probability and based at least in part on a block length of the systematic polar encoder.

6. The first wireless communications device of claim 2, wherein, to map the plurality of input bits to the plurality of bit channels, the one or more processors are individually or collectively operable to execute the code to cause the first wireless communications device to:

map respective bits of the plurality of input bits to respective bit channels of the plurality of bit channels, the respective bits being ordered according to an importance metric for each bit, and the respective bit channels being ordered according to a protection level for each bit channel, wherein the respective bits are mapped to the respective bit channels based at least in part on an ordering of the respective bits and an ordering of the respective bit channels.

7. The first wireless communications device of claim 2, wherein a ratio between a first quantity of bit channels of the first subset of bit channels and a second quantity of bit channels of the second subset of bit channels is based at least in part on a channel capacity of a communication channel between the first wireless communications device and the second wireless communications device.

8. The first wireless communications device of claim 1, wherein the one or more processors are individually or collectively further operable to execute the code to cause the first wireless communications device to:

append a set of cyclic redundancy check bits to the plurality of input bits; and encrypt the single codeword, wherein the single codeword transmitted to the second wireless communications device comprises the encrypted single codeword.

9. The first wireless communications device of claim 1, wherein the one or more processors are individually or collectively further operable to execute the code to cause the first wireless communications device to:

communicate an indication of the mapping between the plurality of input bits to the plurality of bit channels with the second wireless communications device.

10. The first wireless communications device of claim 1, wherein:

the mapping between the plurality of input bits to the plurality of bit channels is predefined or preconfigured.

11. The first wireless communications device of claim 1, wherein the plurality of information bits comprises a stream of extended reality data.

12. The first wireless communications device of claim 1, wherein the plurality of information bits is associated with one or more applications that operate in accordance with one or more bit error rate parameters, the one or more applications being associated with real-time video or real-time audio, or any combination thereof.

13. A second wireless communications device, comprising:

one or more memories storing processor-executable code; and one or more processors coupled with the one or more memories and individually or collectively operable to execute the code to cause the second wireless communications device to:

receive a single codeword corresponding to a plurality of information bits from a first wireless communications device;

decode the single codeword using a systematic polar decoder to generate a plurality of bits, wherein the plurality of bits represent the plurality of information bits based at least in part on a mapping between the plurality of information bits and the plurality of bits, and wherein the plurality of bits are ordered in accordance with a plurality of bit channels; and reorder the plurality of information bits based at least in part on a mapping between of the plurality of bits and the plurality of bit channels, the mapping based at least in part on respective priorities of the plurality of information bits and respective protection levels of the plurality of bit channels, wherein information bits of the plurality of information bits that have a higher priority correspond to bit channels of the plurality of bit channels that have a higher protection level in accordance with the mapping.

14. The second wireless communications device of claim 13, wherein the plurality of bit channels includes a first subset of bit channels and a second subset of bit channels, the first subset of bit channels comprising information bit channels and the second subset of bit channels comprising frozen bit channels.

15. The second wireless communications device of claim 14, wherein an order of the first subset of bit channels is in accordance with the respective protection levels of the first subset of bit channels, each respective protection level being based at least in part on an error probability for each bit channel of the first subset of bit channels, wherein the plurality of bits are mapped to the first subset of bit channels based at least in part on the order of the first subset of bit channels.

16. The second wireless communications device of claim 14, wherein the respective protection levels of the first subset of bit channels is based at least in part on a weighting applied to respective error probabilities associated with the first subset of bit channels, wherein the order of the first subset of bit channels is based at least in part on an evaluation of a bit error rate associated with each error probability.

17. The second wireless communications device of claim 14, wherein the respective protection levels of the first subset of bit channels is based at least in part on a threshold error probability associated with the plurality of bit channels, and wherein the order of the first subset of bit channels is based at least in part on an evaluation starting from a last-indexed bit channel of the plurality of bit channels to identify an index associated with the threshold error probability, and a subsequent evaluation of bit channels having indices that are greater than the index associated with the threshold error probability and based at least in part on a block length of the systematic polar decoder.

18. A method for wireless communications at a first wireless communications device, comprising:

receiving a plurality of information bits for transmission to a second wireless communications device, wherein a plurality of input bits represent the plurality of information bits based at least in part on a mapping between the plurality of information bits and the plurality of input bits;

mapping the plurality of input bits to a plurality of bit channels of a systematic polar encoder based at least in part on respective priorities of the plurality of information bits and respective protection levels of the plurality of bit channels, wherein information bits of the plurality of information bits that have a higher priority correspond to bit channels of the plurality of bit channels that have a higher protection level in accordance with the mapping;

encoding the plurality of input bits using the systematic polar encoder in accordance with mapping the plurality of input bits to the plurality of bit channels to generate a single codeword corresponding to the plurality of information bits; and transmitting the single codeword to the second wireless communications device.

19. The method of claim 18, wherein mapping the plurality of input bits to the plurality of bit channels comprises:

determining a first subset of bit channels from the plurality of bit channels based at least in part on a respective protection level for each bit channel of the plurality of bit channels, the first subset of bit channels comprising information bit channels, wherein a second subset of bit channels of the plurality of bit channels comprises frozen bit channels; and mapping the plurality of input bits to the first subset of bit channels.

20. The method of claim 19, further comprising:

ordering the first subset of bit channels in accordance with the respective protection levels of the first subset of bit channels, each respective protection level being based at least in part on an error probability for each bit channel of the first subset of bit channels, wherein mapping the plurality of input bits to the first subset of bit channels is based at least in part on ordering the first subset of bit channels.

21. The method of claim 20, further comprising:

identifying the first subset of bit channels based at least in part on a weighting applied to respective error probabilities associated with the first subset of bit channels, wherein the ordering is based at least in part on an evaluation of a bit error rate associated with each error probability.

22. The method of claim 20, further comprising:

identifying the first subset of bit channels based at least in part on a threshold error probability associated with the plurality of bit channels, wherein the ordering is based at least in part on an evaluation starting from a last-indexed bit channel of the plurality of bit channels to identify an index associated with the threshold error probability, and subsequently evaluating bit channels having indices that are greater than the index associated with the threshold error probability and based at least in part on a block length of the systematic polar encoder.

23. The method of claim 19, wherein mapping the plurality of input bits to the plurality of bit channels comprises:

mapping respective bits of the plurality of input bits to respective bit channels of the plurality of bit channels, the respective bits being ordered according to an importance metric for each bit, and the respective bit channels being ordered according to a protection level for each bit channel, wherein the respective bits are mapped to the respective bit channels based at least in part on an ordering of the respective bits and an ordering of the respective bit channels.

24. The method of claim 19, wherein a ratio between a first quantity of bit channels of the first subset of bit channels and a second quantity of bit channels of the second subset of bit channels is based at least in part on a channel capacity of a communication channel between the first wireless communications device and the second wireless communications device.

25. The method of claim 18, further comprising:

appending a set of cyclic redundancy check bits to the plurality of input bits; and encrypting the single codeword, wherein the single codeword transmitted to the second wireless communications device comprises the encrypted single codeword.

26. The method of claim 18, further comprising:

communicating an indication of the mapping between the plurality of input bits to the plurality of bit channels with the second wireless communications device.

27. A method for wireless communications at a second wireless communications device, comprising:

receiving a single codeword corresponding to a plurality of information bits from a first wireless communications device;

decoding the single codeword using a systematic polar decoder to generate a plurality of bits, wherein the plurality of bits represent the plurality of information bits based at least in part on a mapping between the plurality of information bits and the plurality of bits, and wherein the plurality of bits are ordered in accordance with a plurality of bit channels; and reordering the plurality of information bits based at least in part on a mapping between of the plurality of bits and the plurality of bit channels, the mapping based at least in part on respective priorities of the plurality of information bits and respective protection levels of the plurality of bit channels, wherein information bits of the plurality of information bits that have a higher priority correspond to bit channels of the plurality of bit channels that have a higher protection level in accordance with the mapping.

28. The method of claim 27, wherein the plurality of bit channels includes a first subset of bit channels and a second subset of bit channels, the first subset of bit channels comprising information bit channels and the second subset of bit channels comprising frozen bit channels.

29. The method of claim 28, wherein an order of the first subset of bit channels is in accordance with the respective protection levels of the first subset of bit channels, each respective protection level being based at least in part on an error probability for each bit channel of the first subset of bit channels, wherein the plurality of bits are mapped to the first subset of bit channels based at least in part on the order of the first subset of bit channels.

30. The method of claim 28, wherein the respective protection levels of the first subset of bit channels is based at least in part on a weighting applied to respective error probabilities associated with the first subset of bit channels, wherein the order of the first subset of bit channels is based at least in part on an evaluation of a bit error rate associated with each error probability.

* * * * *